US012126925B2

United States Patent
Awatani et al.

(10) Patent No.: US 12,126,925 B2
(45) Date of Patent: Oct. 22, 2024

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventors: Yoshio Awatani, Kanagawa (JP); Yosuke Ueno, Kanagawa (JP); Takashi Moue, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 61 days.

(21) Appl. No.: 17/783,707

(22) PCT Filed: Sep. 15, 2020

(86) PCT No.: PCT/JP2020/034820
§ 371 (c)(1),
(2) Date: Jun. 9, 2022

(87) PCT Pub. No.: WO2021/124628
PCT Pub. Date: Jun. 24, 2021

(65) Prior Publication Data
US 2023/0007203 A1 Jan. 5, 2023

(30) Foreign Application Priority Data

Dec. 18, 2019 (JP) .................................. 2019-227806

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14612* (2013.01); *H01L 27/14643* (2013.01); *H04N 25/709* (2023.01); *H04N 25/772* (2023.01)

(58) Field of Classification Search
CPC .... H04N 25/75; H04N 25/709; H04N 25/772; H04N 25/79; H04N 25/78; H01L 27/14612; H01L 27/14643
See application file for complete search history.

(56) References Cited

U.S. PATENT DOCUMENTS

2010/0039543 A1* 2/2010 Muroshima .......... H04N 25/627
348/300
2011/0292264 A1* 12/2011 Kubo ................... H04N 25/767
348/294

(Continued)

FOREIGN PATENT DOCUMENTS

CN 207321395 U 5/2018
JP 2004048558 A * 2/2004
(Continued)

OTHER PUBLICATIONS

International Search Report and Written Opinion of PCT Application No. PCT/JP2020/034820, issued on Nov. 24, 2020, 10 pages of ISRWO.

*Primary Examiner* — Jason A Flohre
(74) *Attorney, Agent, or Firm* — CHIP LAW GROUP

(57) ABSTRACT

Provided is a solid-state imaging element including a pixel circuit and a comparison transistor. In the solid-state imaging element, the pixel circuit generates a pixel signal and outputs the pixel signal to a vertical signal line. Further, the comparison transistor has a source connected to a constant current source configured to supply a constant current to the vertical signal line. The comparison transistor has a gate to which a predetermined reference signal is input. Further, the comparison transistor has a drain from which a comparison (Continued)

result between the pixel signal and the reference signal is output.

20 Claims, 23 Drawing Sheets

(51) Int. Cl.
*H04N 25/709* (2023.01)
*H04N 25/772* (2023.01)

(56) References Cited

U.S. PATENT DOCUMENTS

| | | | |
|---|---|---|---|
| 2016/0295142 A1* | 10/2016 | Yoshida | H04N 25/62 |
| 2016/0360137 A1* | 12/2016 | Sakuragi | H04N 25/75 |
| 2017/0085819 A1* | 3/2017 | Lee | H04N 25/77 |
| 2017/0318248 A1* | 11/2017 | Maehashi | H04N 25/75 |
| 2018/0103222 A1* | 4/2018 | Yan | H04N 25/75 |
| 2018/0262704 A1* | 9/2018 | Xue | H04N 25/766 |
| 2018/0288346 A1* | 10/2018 | Yoshida | H04N 25/75 |
| 2019/0297295 A1* | 9/2019 | Roberts | H04N 25/77 |
| 2021/0036037 A1* | 2/2021 | Matsumoto | H04N 25/75 |
| 2021/0185262 A1* | 6/2021 | Osawa | H04N 23/00 |
| 2022/0247967 A1* | 8/2022 | Matsuzawa | H03M 1/123 |

FOREIGN PATENT DOCUMENTS

| | | |
|---|---|---|
| JP | 2005-311487 A | 11/2005 |
| JP | 2010-187317 A | 8/2010 |

\* cited by examiner

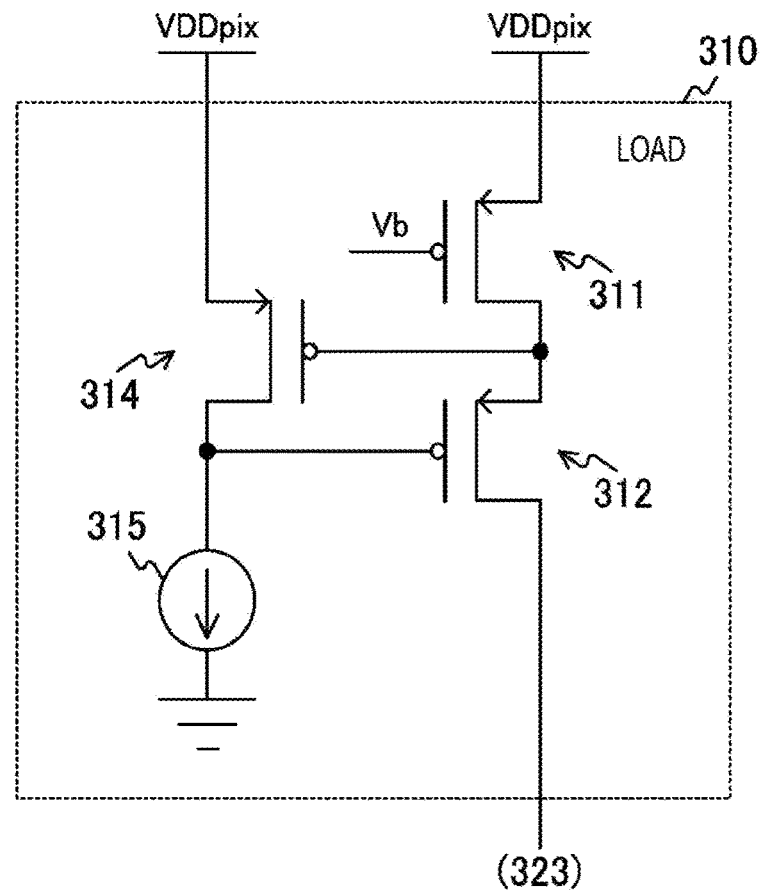
FIG. 7A
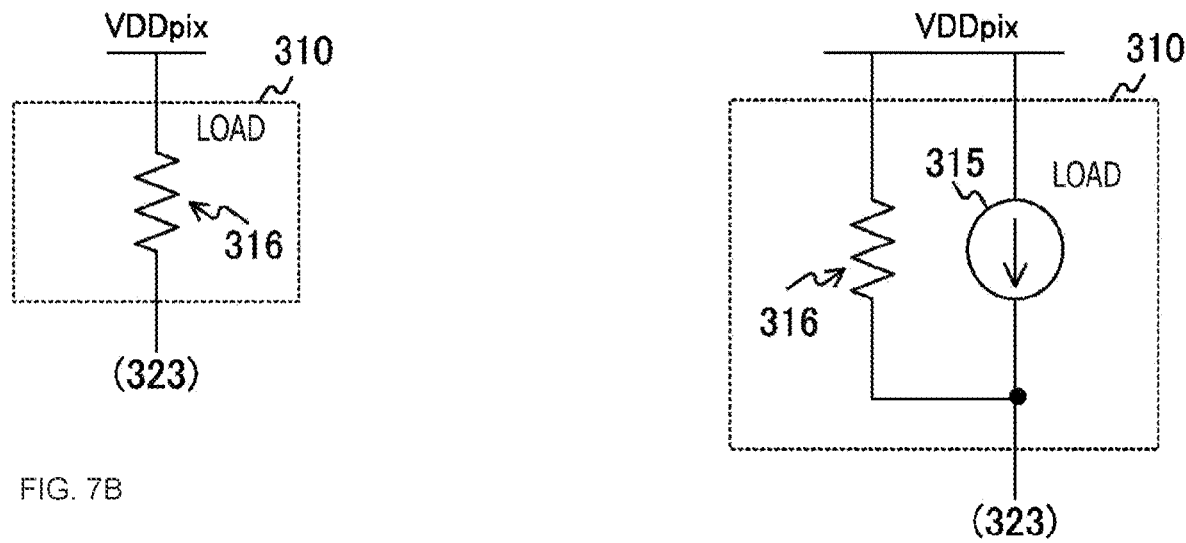
FIG. 7B
FIG. 7C

SOLID-STATE IMAGING ELEMENT AND IMAGING DEVICE

CROSS REFERENCE TO RELATED APPLICATIONS

This application is a U.S. National Phase of International Patent Application No. PCT/JP2020/034820 filed on Sep. 15, 2020, which claims priority benefit of Japanese Patent Application No. JP 2019-227806 filed in the Japan Patent Office on Dec. 18, 2019. Each of the above-referenced applications is hereby incorporated herein by reference in its entirety.

TECHNICAL FIELD

The present technology relates to a solid-state imaging element. Specifically, the present technology relates to a solid-state imaging element configured to compare a pixel signal and a reference signal to each other and an imaging device.

BACKGROUND ART

Hitherto, in solid-state imaging elements and the like, single-slope ADCs (Analog to Digital Converters) including comparators and counters have widely been used because of their simplicity in configuration. For example, there has been proposed a single-slope ADC using, as a comparator, a pMOS transistor that has a gate to which a reference signal is input and that is inserted between a vertical signal line and a constant current source (for example, see PTL 1). A potential difference between the reference signal and a pixel signal is applied between the gate and source of the pMOS transistor, and the pMOS transistor is turned on or off depending on the potential difference (gate-source voltage) to output a comparison result from the drain thereof.

CITATION LIST

Patent Literature

[PTL 1]
U.S. Patent Application Publication No. 2018/0103222

SUMMARY

Technical Problem

In the related art described above, the pMOS transistor is used as the comparator instead of a differential amplifier circuit to achieve reductions in mounting area and power consumption of the ADC as compared to a case where a differential amplifier circuit is used. However, the ADC described above has a problem in that the dynamic range of a pixel signal is narrower than that in a case where no pMOS transistor is inserted. This problem arises since the pMOS transistor is inserted to the vertical signal line and the amplitude of a pixel signal is reduced by a voltage necessary for driving the pMOS transistor. With an increase in power supply voltage, the amplitude can be increased to expand the dynamic range, but the power consumption is increased undesirably.

The present technology has been made in view of such a circumstance and has an object to expand the dynamic range of a solid-state imaging element including a comparator.

Solution to Problem

The present technology has been made to solve the problem described above, and according to a first aspect thereof, there is provided a solid-state imaging element including a pixel circuit configured to generate a pixel signal and output the pixel signal to a vertical signal line, and a comparison transistor having a source connected to a constant current source configured to supply a constant current to the vertical signal line, a gate to which a predetermined reference signal is input, and a drain from which a comparison result between the pixel signal and the reference signal is output. This provides an action of dynamic range expansion.

Further, in the first aspect, the solid-state imaging element may further include a clamp transistor configured to limit an amplitude of a signal indicating the comparison result within a predetermined range. This provides an action of amplitude limitation.

Further, in the first aspect, the solid-state imaging element may further include an amplifier circuit configured to amplify a signal indicating the comparison result. This provides an action of amplification of signals indicating comparison results.

Further, in the first aspect, the amplifier circuit may include an amplification transistor configured to amplify a voltage signal indicating the comparison result, and the comparison transistor may output the voltage signal. This provides an action of voltage signal amplification.

Further, in the first aspect, the amplifier circuit may include a transimpedance amplifier configured to convert a current signal indicating the comparison result to a voltage signal, and the comparison transistor may output the current signal. This provides an action of power supply voltage reduction.

Further, in the first aspect, the solid-state imaging element may further include a variable resistor configured to adjust an amplitude of the pixel signal. This provides an action of noise reduction.

Further, in the first aspect, the variable resistor may include a transistor having a gate to which a bias voltage is applied. This provides an action of resistance value control.

Further, in the first aspect, the variable resistor may include a pair of transistors connected in parallel. This provides an action of resistance value control.

Further, in the first aspect, the variable resistor may include a predetermined number of resistors connected in parallel, and a switch configured to control the number of the resistors to be connected. This provides an action of resistance value control.

Further, in the first aspect, the variable resistor may include a switched capacitor. This provides an action of resistance value control.

Further, in the first aspect, the solid-state imaging element may further include a load inserted between a power supply and the drain. This provides an action that a comparison transistor having a drain connected to a load performs a comparison.

Further, in the first aspect, the load may include a transistor having a gate to which a predetermined bias voltage is applied. This provides an action of bias voltage-based resistance value control.

Further, in the first aspect, the load may include a pair of transistors in a cascode connection. This provides an action that the drain of a comparison transistor is connected to a pair of transistors in a cascode connection.

Further, in the first aspect, the load may include a super cascode circuit. This provides an action that the drain of a comparison transistor is connected to a super cascode circuit.

Further, in the first aspect, the load may include a resistor. This provides an action that the drain of a comparison transistor is connected to a resistor.

Further, in the first aspect, the solid-state imaging element may further include a capacitor connected to the drain and the source. This provides an action of bandlimiting.

Further, in the first aspect, the pixel circuit may be provided on a predetermined pixel chip, at least a part of a comparator including the comparison transistor may be provided on a circuit chip different from the pixel chip, and the pixel circuit may have a power supply separated from a power supply of the comparator. This provides an action of circuit scale reduction of each chip.

Further, in the first aspect, the pixel circuit may be provided in each pixel of a plurality of pixels arrayed in a two-dimensional lattice pattern in a pixel array section, the vertical signal line may be formed in each column of the pixel array section, and the comparison transistor may be provided for each of the vertical signal lines. This provides an action of reading speed enhancement.

Further, in the first aspect, the pixel circuit and the comparison transistor may be provided in each pixel of a plurality of pixels arrayed in a two-dimensional lattice pattern. This provides an action of row-by-row pixel signal reading.

Further, according to a second aspect of the present technology, there is provided an imaging device including a pixel circuit configured to generate a pixel signal and output the pixel signal to a vertical signal line, a comparison transistor having a source connected to a constant current source configured to supply a constant current to the vertical signal line, a gate to which a predetermined reference signal is input, and a drain from which a comparison result between the pixel signal and the reference signal is output, and a counter configured to generate a digital signal based on the comparison result. This provides an action of digital signal dynamic range expansion.

BRIEF DESCRIPTION OF DRAWINGS

FIGS. 7A, 7B, and 7C illustrate circuit diagrams depicting other examples of the load according to the first embodiment of the present technology.

DESCRIPTION OF EMBODIMENTS

Now, modes for carrying out the present technology (hereinafter referred to as "embodiments") are described. Description will be made in the following order.

1. First embodiment (an example in which a comparison transistor is connected in parallel)

2. Second embodiment (an example in which a comparison transistor is connected in parallel and a current to voltage conversion is performed)

3. Third embodiment (an example in which a comparison transistor is connected in parallel and variable resistors are provided)

4. Application example to mobile body

1. First Embodiment

[Configuration Example of Imaging Device]

Figure 1:
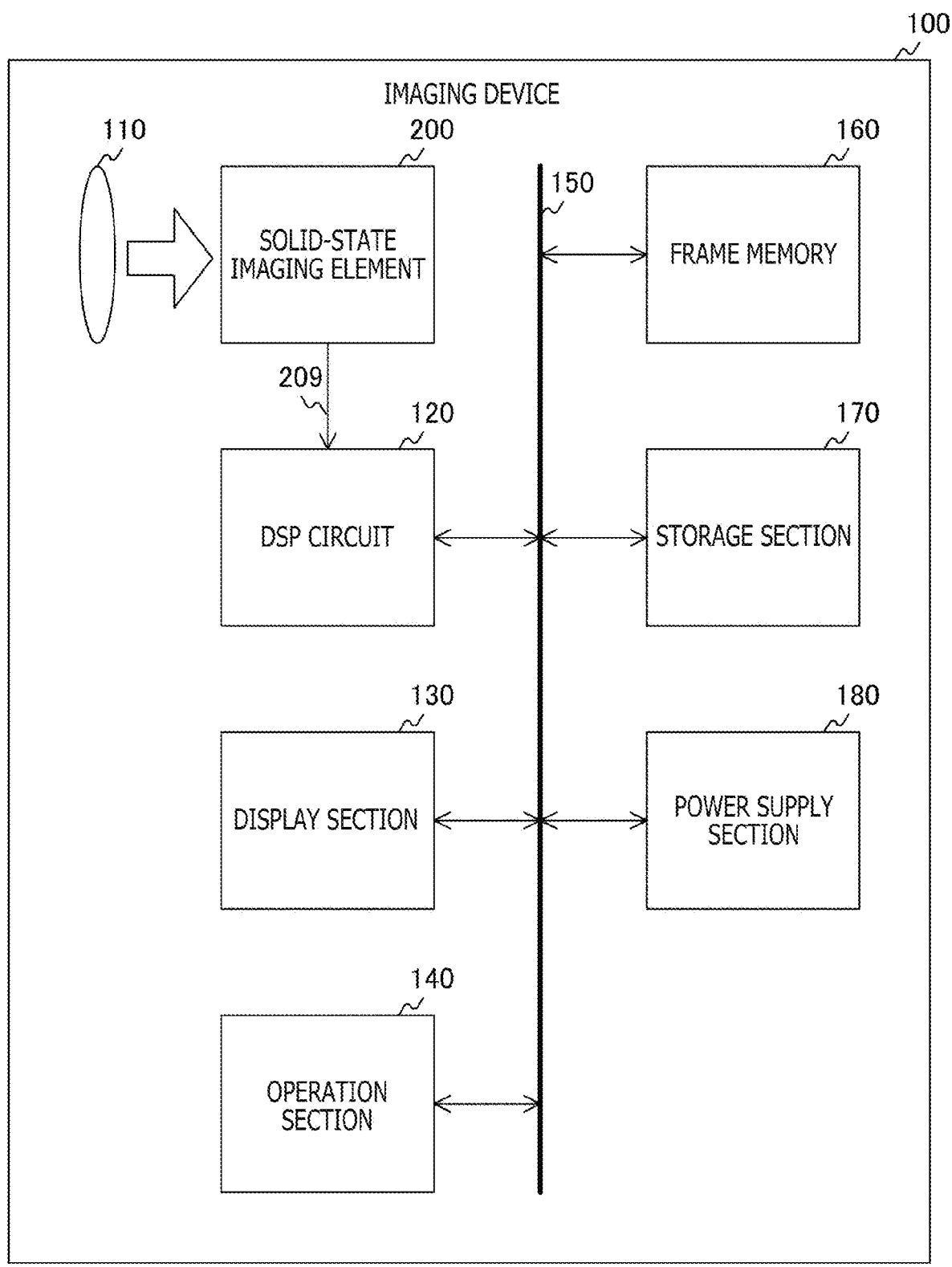
FIG. 1 is a block diagram depicting a configuration example of an imaging device according to a first embodiment of the present technology.

FIG. 1 is a block diagram depicting a configuration example of an imaging device 100 according to a first embodiment of the present technology. The imaging device 100 is a device configured to capture image data (frames) and includes an optical section 110, a solid-state imaging element 200, and a DSP (Digital Signal Processing) circuit 120. Further, the imaging device 100 includes a display section 130, an operation section 140, a bus 150, a frame memory 160, a storage section 170, and a power supply section 180. Assumed examples of the imaging device 100 include, other than digital cameras such as digital still cameras, smartphones and personal computers having an imaging function and vehicle-mounted cameras.

The optical section 110 focuses light from objects and guides the light onto the solid-state imaging element 200. The solid-state imaging element 200 generates frames through photoelectric conversion in synchronization with vertical synchronization signals. Here, a vertical synchronization signal is a periodic signal at a predetermined frequency that indicates an imaging timing. The solid-state imaging element 200 supplies the generated frames to the DSP circuit 120 through a signal line 209.

The DSP circuit 120 executes predetermined signal processing on frames from the solid-state imaging element 200. The DSP circuit 120 outputs the processed frames to the frame memory 160 or the like through the bus 150.

The display section 130 displays frames. Assumed examples of the display section 130 include liquid crystal panels and organic EL (Electro Luminescence) panels. The operation section 140 generates operation signals according to user operation.

The bus 150 is a common path for allowing the optical section 110, the solid-state imaging element 200, the DSP circuit 120, the display section 130, the operation section 140, the frame memory 160, the storage section 170, and the power supply section 180 to exchange data therebetween.

The frame memory 160 holds frames. The storage section 170 stores a variety of pieces of data such as frames. The power supply section 180 supplies power to the solid-state imaging element 200, the DSP circuit 120, the display section 130, and the like.

[Configuration Example of Solid-State Imaging Element]

Figure 2:
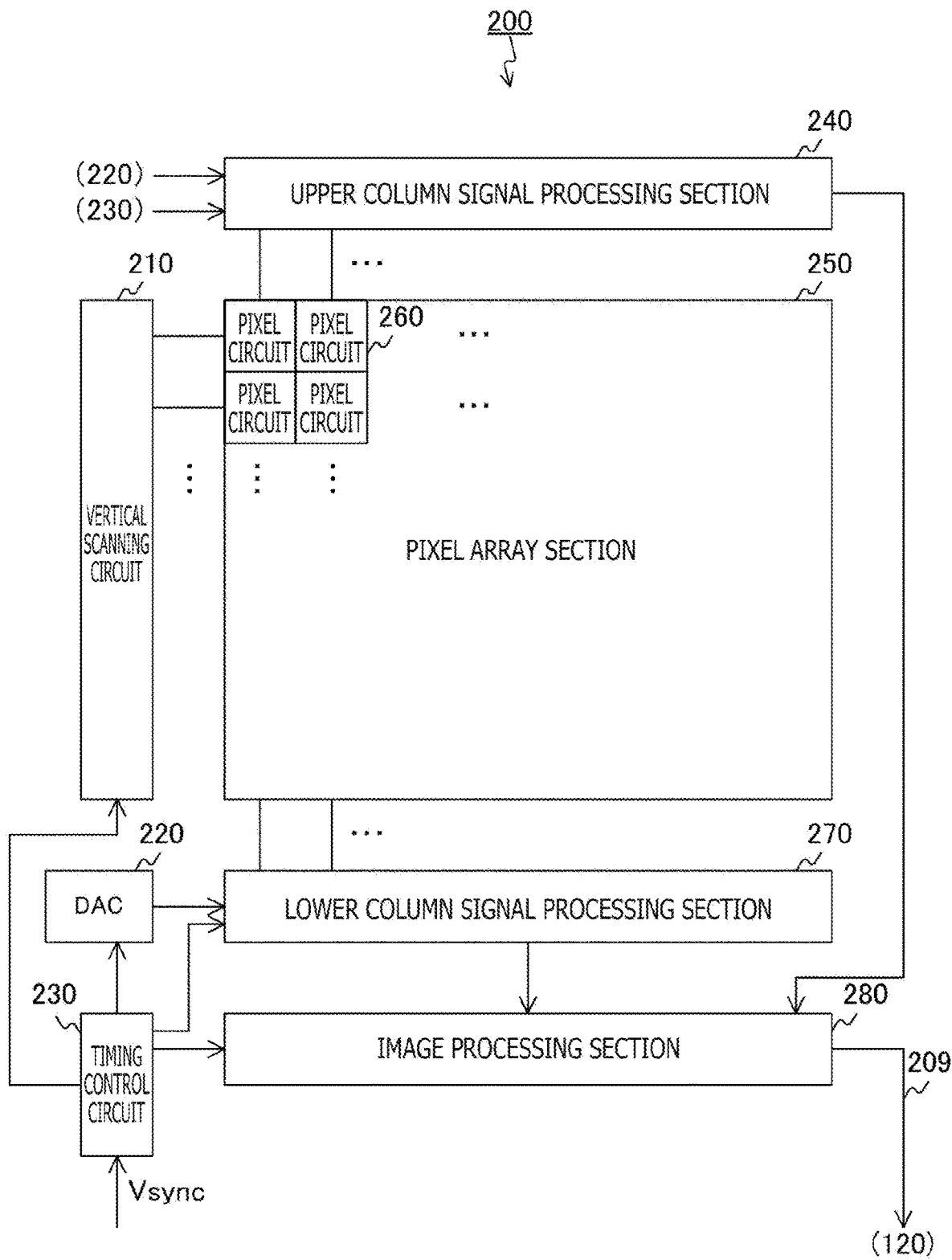
FIG. 2 is a block diagram depicting a configuration example of a solid-state imaging element according to the first embodiment of the present technology.

FIG. 2 is a block diagram depicting a configuration example of the solid-state imaging element 200 according to the first embodiment of the present technology. The solid-state imaging element 200 includes a vertical scanning circuit 210, a DAC (Digital to Analog Converter) 220, a timing control circuit 230, an upper column signal processing section 240, a pixel array section 250, a lower column signal processing section 270, and an image processing section 280. Those circuits are provided on a single semiconductor chip, for example.

In the pixel array section 250, a plurality of pixels is arrayed in a two-dimensional lattice pattern. Each pixel includes a pixel circuit 260. In the following, a collection of pixels arrayed in a predetermined horizontal direction is referred to as a "row," and a collection of pixels arrayed in a direction vertical to the row is referred to as a "column."

The vertical scanning circuit 210 sequentially drives the rows to allow analog pixel signals to be output. The pixel circuit 260 generates pixel signals through photoelectric conversion. The pixel circuit 260 outputs the generated pixel signals to any one of the upper column signal processing section 240 and the lower column signal processing section 270. For example, the pixel circuits 260 in odd rows output pixel signals to the upper column signal processing section 240, and the pixel circuits 260 in even rows output pixel signals to the lower column signal processing section 270. It is to be noted that the pixel circuits 260 in odd columns may output pixel signals to the upper column signal processing section 240 and the pixel circuits 260 in even columns may output pixel signals to the lower column signal processing section 270.

The DAC 220 generates a predetermined reference signal through DA (Digital to Analog) conversion and supplies the reference signal to the upper column signal processing section 240 and the lower column signal processing section 270. As a reference signal, for example, a lamp signal that changes in a sloped manner is generated.

The timing control circuit 230 controls, in synchronization with a vertical synchronization signal Vsync, the operation timing of each of the vertical scanning circuit 210, the upper column signal processing section 240, the lower column signal processing section 270, and the image processing section 280.

The upper column signal processing section 240 performs signal processing such as AD (Analog to Digital) conversion or CDS (Correlated Double Sampling) processing on pixel signals for each column. The upper column signal processing section 240 outputs the processed data to the image processing section 280. The lower column signal processing section 270 has a configuration similar to that of the upper column signal processing section 240.

With the upper column signal processing section 240 and the lower column signal processing section 270, a reading speed twice as fast as that in a case where only one of the upper column signal processing section 240 and the lower column signal processing section 270 is provided can be achieved. It is to be noted that a configuration in which only one of the upper column signal processing section 240 and the lower column signal processing section 270 is placed is also possible.

The image processing section 280 receives data from the upper column signal processing section 240 and the lower column signal processing section 270 and performs predetermined image processing on image data having arrayed therein those pieces of data. As the image processing, demosaic processing, noise reduction processing, white balance processing, or the like is executed. The image processing section 280 supplies the processed image data to the DSP circuit 120. It is to be noted that a part or whole of the processing by the image processing section 280 may be executed outside the solid-state imaging element 200.

[Configuration Example of Pixel Circuit]

Figure 3:
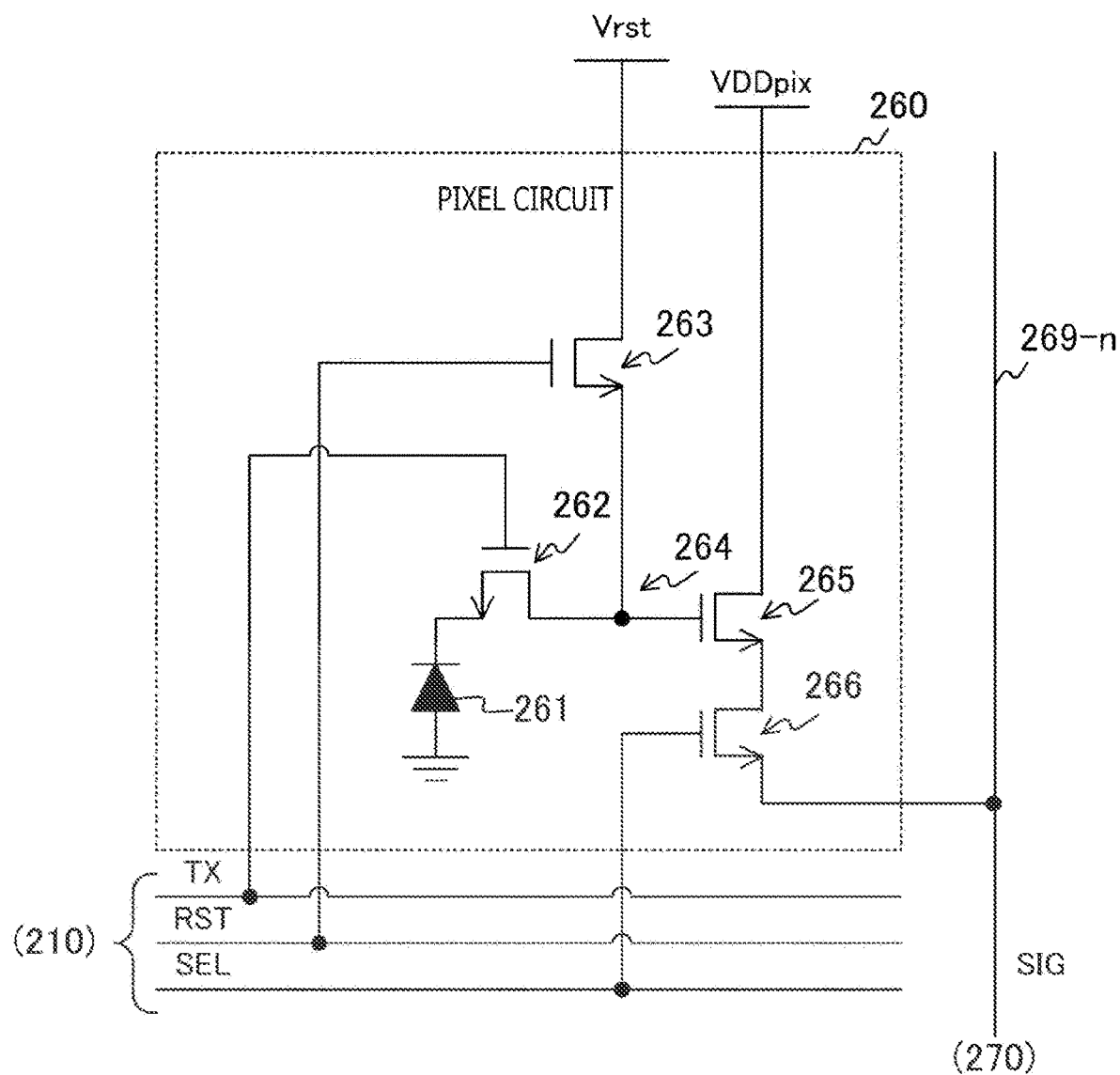
FIG. 3 is a circuit diagram depicting a configuration example of a pixel circuit according to the first embodiment of the present technology.

FIG. 3 is a circuit diagram depicting a configuration example of the pixel circuit 260 according to the first embodiment of the present technology. The pixel circuit 260 includes a photoelectric conversion element 261, a transfer transistor 262, a reset transistor 263, a floating diffusion layer 264, an amplification transistor 265, and a selection transistor 266.

The photoelectric conversion element 261 generates charges through photoelectric conversion of incident light. The transfer transistor 262 transfers charges from the photoelectric conversion element 261 to the floating diffusion layer 264 according to a transfer signal TX from the vertical scanning circuit 210. The reset transistor 263 connects the floating diffusion layer 264 and a reset power supply voltage Vrst to each other according to a reset signal RST from the vertical scanning circuit 210, thereby initializing the amount of charge in the floating diffusion layer 264.

The floating diffusion layer 264 accumulates charges and generates a voltage based on the amount of charge. The amplification transistor 265 amplifies the voltage of the floating diffusion layer 264. The amplification transistor 265 is inserted between a terminal having a power supply voltage VDDpix different from the reset power supply voltage Vrst and the selection transistor 266. The selection transistor 266 outputs an amplified voltage signal as a pixel signal SIG according to a selection signal SEL from the vertical scanning circuit 210. When the number of columns is N (N is an integer), pixel signals from the n-th (n is an integer of from 1 to N) column are transmitted to the lower column signal processing section 270 (or upper column signal processing section 240) through a vertical signal line 269-n.

It is to be noted that the pixel circuit 260 is not limited to the circuit configuration exemplified in the figure and may have any circuit configuration that can generate pixel signals through photoelectric conversion.

[Configuration Example of Lower Column Signal Processing Section]

Figure 4:
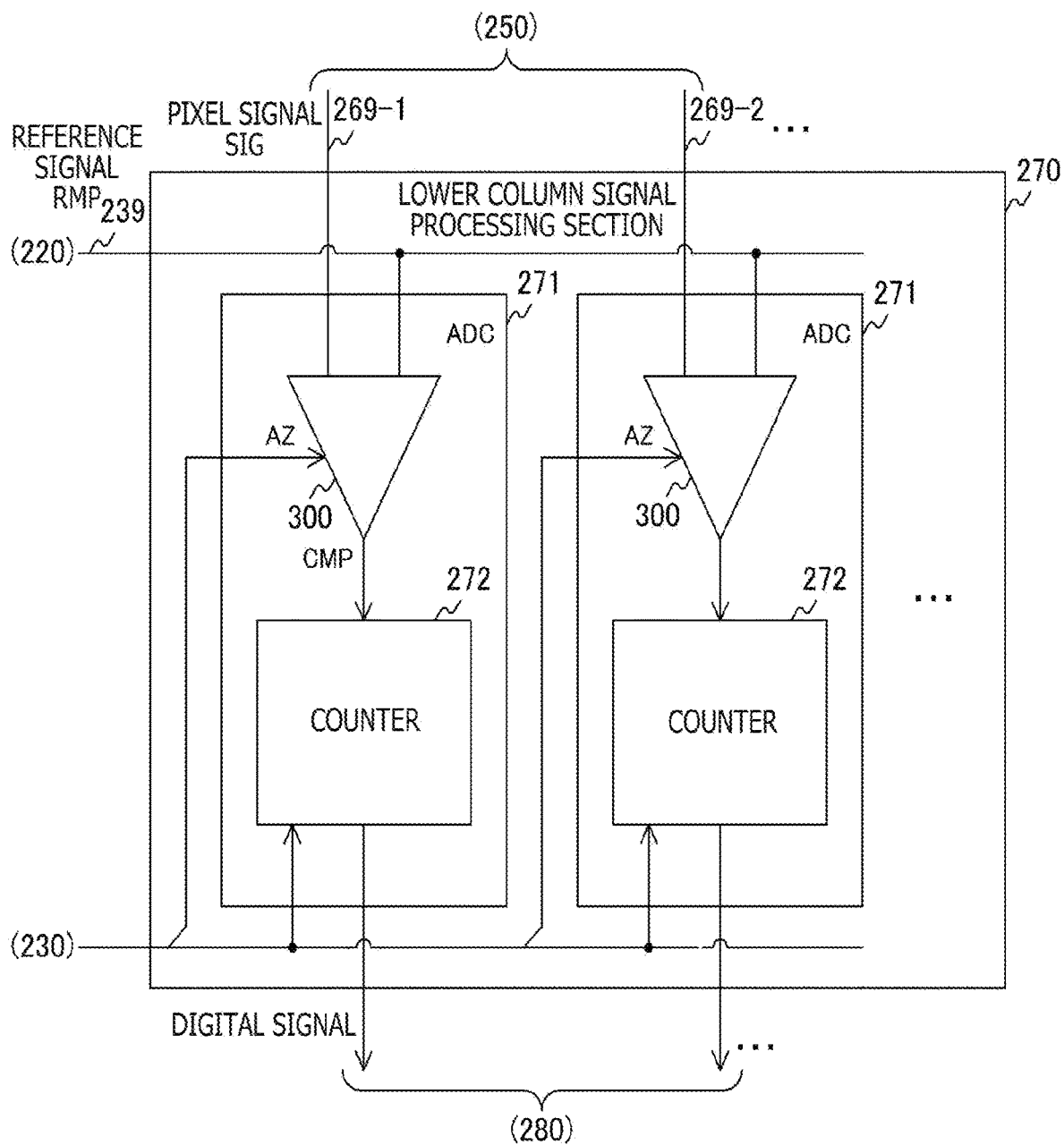
FIG. 4 is a block diagram depicting a configuration example of a lower column signal processing section according to the first embodiment of the present technology.

FIG. 4 is a block diagram depicting a configuration example of the lower column signal processing section 270. The lower column signal processing section 270 includes a plurality of ADCs 271. The ADC 271 is provided in each column. In a case where the number of columns is N, the N ADCs 271 are arrayed.

The ADC 271 converts an analog pixel signal SIG from the corresponding column to a digital signal. The ADC 271 includes a comparator 300 and a counter 272.

The comparator 300 compares a reference signal RMP and the pixel signal SIG from the corresponding column to each other. The comparator 300 supplies a comparison result signal CMP indicating the comparison result to the counter 272. Further, the comparator 300 receives an auto-zero signal AZ input from the timing control circuit 230.

The counter 272 counts under the control of the timing control circuit 230 over a period taken for inversion of the comparison result signal CMP, to thereby obtain a count value. The counter 272 supplies a digital signal indicating the count value to the image processing section 280.

Here, a pixel signal includes a reset level and a signal level. The reset level is a level obtained when the pixel circuit 260 is initialized, and the signal level is a level based on the amount of exposure in transferring charges to the floating diffusion layer 264.

The counter 272 performs down-counting in a conversion period at the reset level and performs up-counting in a conversion period at a signal level, for example. With this, CDS processing of obtaining a difference between the reset level and a signal level is realized. It is to be noted that the counter 272 can also perform only one of up-counting and down-counting. In this case, a circuit configured to perform CDS processing is added on the downstream of the counter 272.

The ADC 271 configured to perform an AD conversion by the comparator 300 and the counter 272 as exemplified in the figure is called a "single-slope ADC."

[Configuration Example of Comparator]

Figure 5:
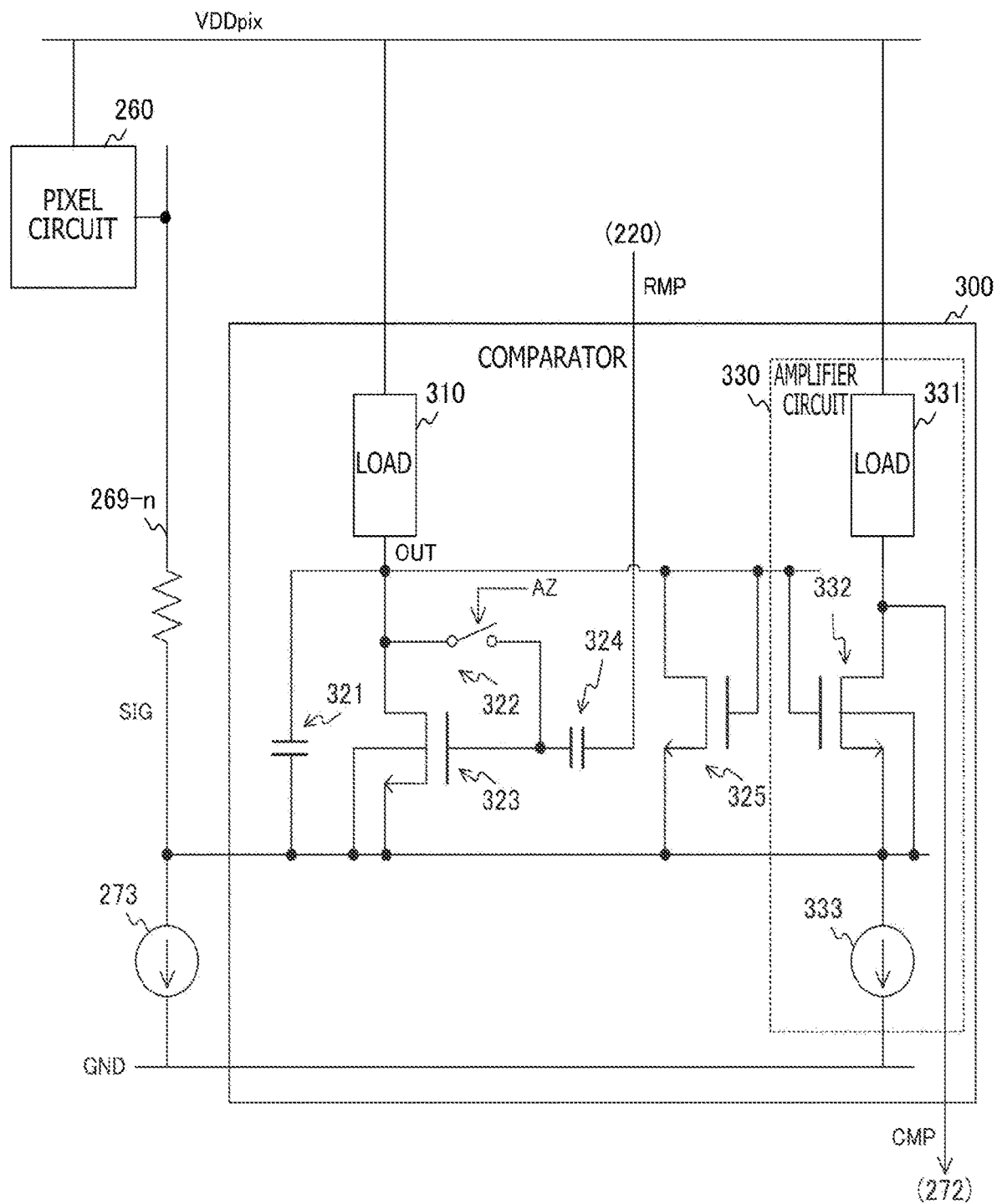
FIG. 5 is a circuit diagram depicting a configuration example of a comparator according to the first embodiment of the present technology.

FIG. 5 is a circuit diagram depicting a configuration example of the comparator 300 according to the first embodiment of the present technology. A constant current source 273 is connected to each of the vertical signal lines 269-n. The constant current source 273 supplies a constant current to the vertical signal line 269-n. The constant current source 273 is placed inside the upper column signal processing section 240 or the lower column signal processing section 270. It is to be noted that a resistor in the figure represents a wiring resistance of the vertical signal line 269-n.

Further, the comparator 300 includes a load 310, a capacitor 321, an auto-zero switch 322, a comparison transistor 323, a capacitor 324, a clamp transistor 325, and an amplifier circuit 330.

The load 310 is inserted between the power supply voltage VDDpix and the drain of the comparison transistor 323. The capacitor 321 has one end connected to the drain of the comparison transistor 323 and the other end connected to the source of the comparison transistor 323. With the capacitor 321 connected, noise that the comparator 300 generates can be reduced.

The auto-zero switch 322 short-circuits a path between the gate and drain of the comparison transistor 323 according to the auto-zero signal AZ from the timing control circuit 230. When the auto-zero switch 322 is closed, potentials at the gate and drain of the comparison transistor 323 are the same, so that a potential difference between a threshold voltage of the transistor 323 and the reference signal RMP is written to the capacitor 324. Meanwhile, when the auto-zero switch 324 is opened, a potential difference between the gate and drain of the comparison transistor 323 is continuously stored.

The comparison transistor 323 compares the pixel signal SIG and the reference signal RMP to each other. As the comparison transistor 323, an nMOS (n-channel Metal Oxide Semiconductor) transistor is used. The reference signal RMP is input to the gate of the comparison transistor 323 from the DAC 220 through the capacitor 324. Further, the source and back gate of the comparison transistor 323 are connected to the constant current source 273. With this connection configuration, a potential difference between the pixel signal SIG and the reference signal RMP is applied between the gate and source of the comparison transistor 323. The comparison transistor 323 is turned on or off depending on whether the potential difference (that is, gate-source voltage) is higher than the threshold voltage of the comparison transistor 323 or not. The drain voltage of the turned-on comparison transistor 323 is lower than that of the turned-off comparison transistor 323. That is, the drain voltage takes a high level or a low level depending on a potential difference between the pixel signal SIG and the reference signal RMP and has a value indicating the result of a comparison between the pixel signal SIG and the reference signal RMP. A voltage signal indicating a comparison result is referred to as a "first-stage output signal OUT."

The clamp transistor 325 limits the amplitude of the first-stage output signal OUT within a predetermined range. As the clamp transistor 325, an nMOS transistor is used. The clamp transistor 325 has a gate and a drain both connected to the drain of the comparison transistor 323 (that is, diode connection) and a source connected to the source of the comparison transistor 323. The clamp transistor 325 is designed to have a threshold voltage larger than that of the comparison transistor 323.

The amplifier circuit 330 amplifies the first-stage output signal OUT (that is, voltage signal). The amplifier circuit 330 includes a load 331, an amplification transistor 332, and a constant current source 333. The load 331 is inserted between the power supply voltage VDDpix and the drain of the amplification transistor 332.

The amplification transistor 332 has a gate to which the first-stage output signal OUT is input. The amplification transistor 332 has a back gate and a source connected to the constant current source 333 and the source of the comparison transistor 323. The amplification transistor 332 has a drain from which an amplified signal is output to the counter 272 as the comparison result signal CMP.

Here, as a comparative example, a configuration in which a pMOS (n-channel MOS) transistor is provided instead of the comparison transistor 323 (nMOS transistor) is assumed. In the case where the pMOS transistor is used, the pMOS transistor has a source connected to the vertical signal line 269-n, a drain connected to the constant current source 273, and a gate to which the reference signal RMP is input as in the case described above. That is, the pMOS transistor is inserted in series to the vertical signal line 269-n. Further, as the clamp transistor and the amplification transistor on the second stage, P-type transistors are also used.

In such a comparative example, since the pMOS transistor is inserted in series to the vertical signal line 269-n, the dynamic range is narrowed by a voltage necessary for operating the pMOS transistor (for example, threshold voltage of 0.2 V+output amplitude of 0.4 V=0.6 V). For example, in a case where the power supply voltage is 2.8 volts (V), a voltage drop due to a voltage necessary for operating the pixel circuit 260 and the wiring resistance is 1.0 volt (V), and a voltage necessary for operating the constant current source is 0.4 volts (V), when a voltage necessary for operating the pMOS transistor is 0.6 (V), the amplitude of the level of the vertical signal line contributing to the dynamic range is expressed by the following expression.

$$2.8-1.0-0.6-0.4=0.8 \text{ (V)} \qquad \text{Expression 1}$$

In particular, with regard to the solid-state imaging element 200 in which an accumulated charge amount Qs of the floating diffusion layer is large such as a large sensor, a wide dynamic range is required, and hence, the effect of a drop in dynamic range due to a pMOS transistor is large.

In contrast to this, in the comparator 300 exemplified in the figure, the n-type comparison transistor 323 is used, and the n-type comparison transistor 323 has the source connected to the constant current source 273 and the drain connected to the power supply voltage VDDpix through the load 310. With this connection configuration, the comparison transistor 323 is connected in parallel to the vertical signal line 269-1. With the comparison transistor 323 connected in parallel, a drop in dynamic range due to a pMOS transistor inserted in series can be suppressed. For example, in a case where conditions in terms of the power supply voltage and a potential drop due to the wiring resistance of the vertical signal line are the same as those in the case described above and a voltage necessary for operating the constant current source 273 is 0.4 volts (V) as in the case described above, the amplitude of the level of the vertical signal line contributing to the dynamic range is expressed by the following expression.

$$2.8-1.0-0.4=1.4 \text{ (V)} \qquad \text{Expression 2}$$

When the right sides of Expression 1 and Expression 2 are compared to each other, the configuration in which the comparison transistor 323 is connected in parallel can achieve a larger amplitude than the comparative example and therefore expand the dynamic range.

With the clamp transistor 325, the amplitude of the first-stage output signal OUT can be kept constant irrespective of the amount of exposure, with the result that the satisfactory linearity characteristics of the comparison result inversion timing with respect to the amount of exposure is achieved. Further, since the current of the comparator 300 before and after an inversion is the same, inter-column interference through the power supply or the ground can be suppressed, so that streaking and the like due to inter-column interference can be suppressed.

Further, with the capacitor 321 for bandlimiting provided between the vertical signal line 269-n and the comparison transistor 323 on the first stage, the amount of charge or discharge of the capacitor 321 is not affected by the level of the vertical signal line 269-n, so that the linearity characteristics can be improved.

Further, since comparison results are output from the drain of the comparison transistor 323 on the first stage having the source connected to the vertical signal line 269-n, the level of the reference signal at the time of inversion of the output of the amplification transistor 332 on the second stage follows the level of the vertical signal line 269-n. With this, the linearity can be improved.

Further, the comparison transistor 323 on the first stage and the amplification transistor 332 on the second stage can directly be connected to each other by DC coupling. With this, there is no need to provide a capacitor between the first stage and the second stage, and the circuit area can therefore be reduced.

[Configuration Example of Load]

Figure 6A:
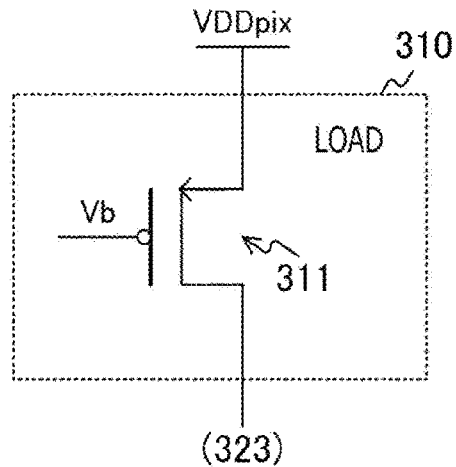
FIGS. 6A, 6B, and 6C illustrate circuit diagrams depicting configuration examples of a load according to the first embodiment of the present technology.
Figure 6B:
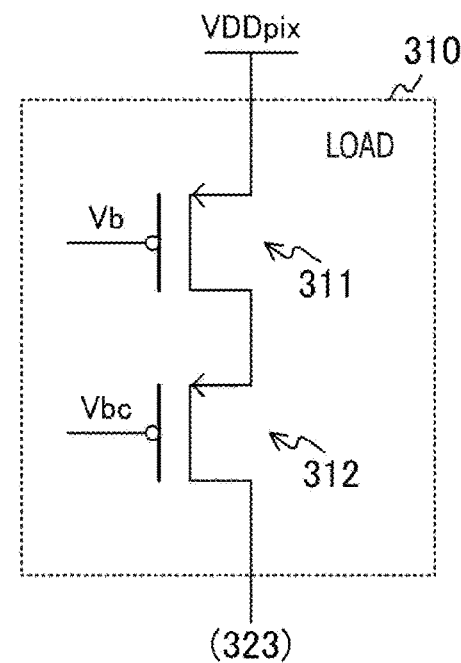
Figure 6C:
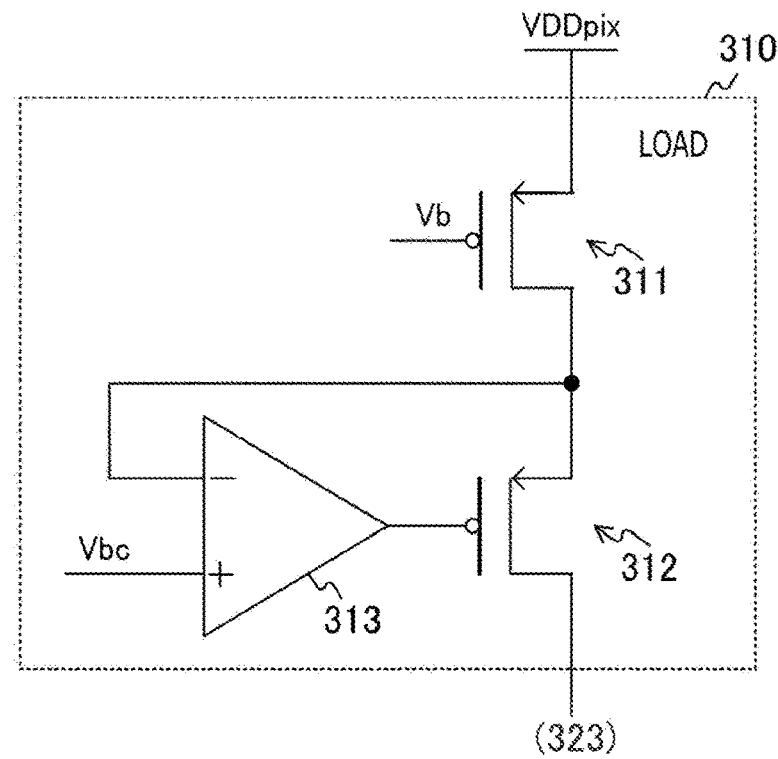

FIGS. 6A, 6B, and 6C illustrate circuit diagrams depicting configuration examples of the load 310 according to the first embodiment of the present technology. In the figure, FIG. 6A is an exemplary circuit diagram of the load 310 using a pMOS transistor, FIG. 6B is an exemplary circuit diagram of the load 310 using transistors in a cascode connection, and c is an exemplary circuit diagram of the load 310 using a super cascode circuit.

As exemplified in FIG. 6A, a pMOS transistor 311 can be used as the load 310. The pMOS transistor 311 is inserted between the power supply voltage VDDpix and the comparison transistor 323 and has a gate to which a predetermined bias voltage Vb is applied.

Further, as exemplified in FIG. 6B, pMOS transistors 311 and 312 in a cascode connection can also be used as the load 310. The pMOS transistors 311 and 312 are connected in series (that is, cascode connection) between the power supply voltage VDDpix and the comparison transistor 323. The bias voltage Vb is applied to the gate of the pMOS transistor 311, and a bias voltage Vbc is applied to the gate of the pMOS transistor 312.

Further, as exemplified in FIG. 6C, a super cascode circuit using a differential amplifier circuit can also be used as the load 310. This circuit includes the pMOS transistors 311 and 312 in a cascode connection and a differential amplifier circuit 313. The differential amplifier circuit 313 amplifies a difference between a connection node between the pMOS transistors 311 and 312 and the bias voltage Vbc and outputs the amplified difference to the gate of the pMOS transistor 312. Further, the bias voltage Vb is applied to the gate of the pMOS transistor 311.

Further, as exemplified in FIG. 7A, a super cascode circuit using a looped circuit can also be used as the load 310. This circuit includes the pMOS transistors 311 and 312 in a cascode connection, a pMOS transistor 314, and a constant current source 315. The pMOS transistor 314 and the constant current source 315 are connected in series between the power supply voltage VDDpix and the ground voltage. Further, the bias voltage Vb is applied to the gate of the pMOS transistor 311. The gate of the pMOS transistor 314 is connected to the connection node between the pMOS transistors 311 and 312. The gate of the pMOS transistor 312 is connected to a connection node between the pMOS transistor 314 and the constant current source 315.

Further, as exemplified in FIG. 7B, a resistor 316 can also be used as the load 310. Alternatively, as exemplified in FIG. 7C, the resistor 316 and the constant current source 315 that are connected in parallel to the power supply voltage VDDpix can also be used as the load 310.

[Exemplary Operation of Solid-State Imaging Element]

Figure 8:
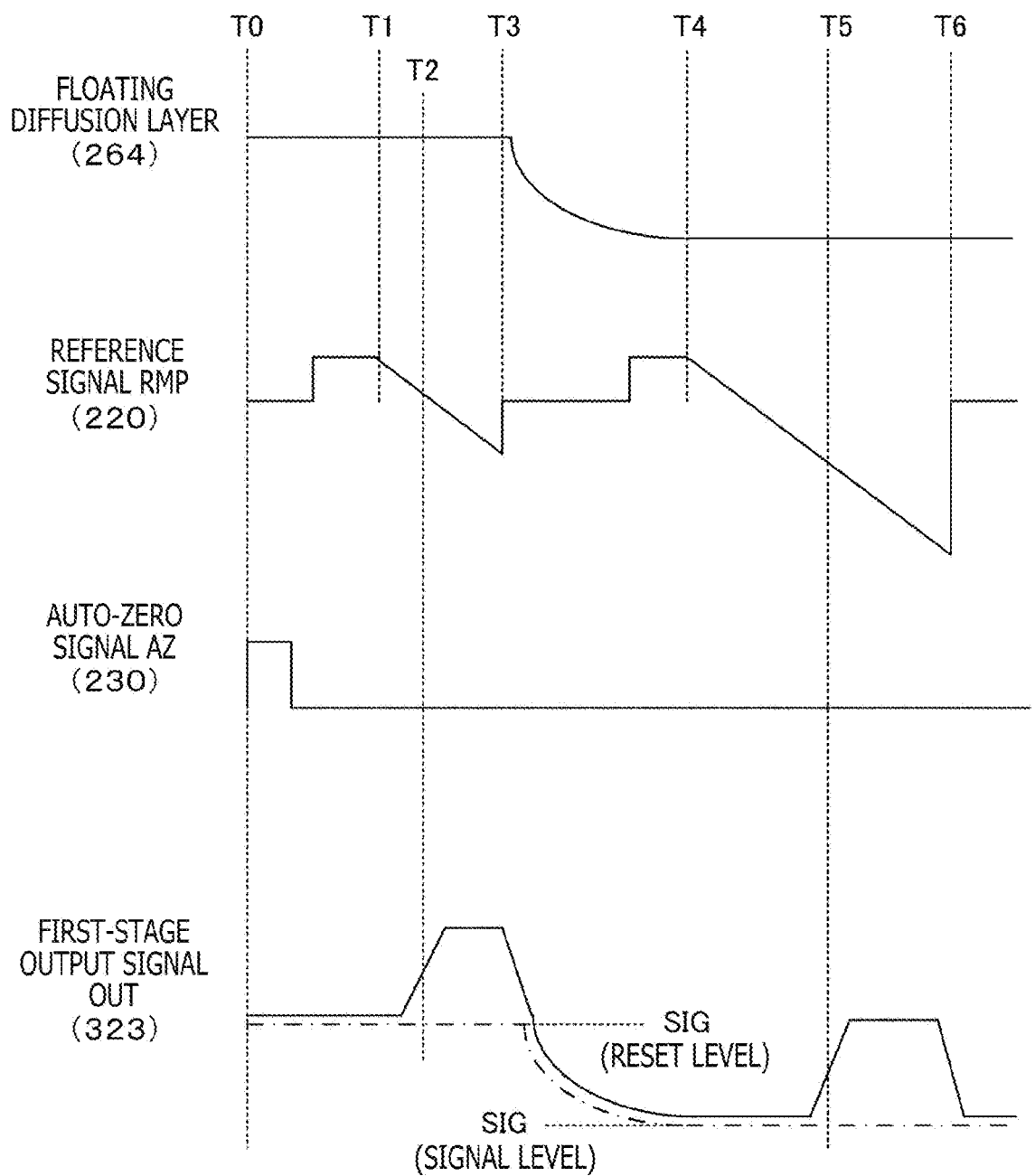
FIG. 8 is a timing chart depicting exemplary operation of the solid-state imaging element according to the first embodiment of the present technology.

FIG. 8 is a timing chart depicting exemplary operation of the solid-state imaging element 200 according to the first embodiment of the present technology. In the figure, a long dashed short dashed line indicates a trajectory of the level of the vertical signal line 269-$n$ (that is, pixel signal SIG).

The timing control circuit 230 supplies, at a timing T0 immediately before an AD conversion, the auto-zero signal AZ over a predetermined pulse period to initialize the comparator 300.

Then, in the conversion period at the reset level from timings T1 to T3, the DAC 220 gradually reduces the reference signal RMP. At a timing T2 at which the reference signal RMP reaches a value equal to or less than the level of the pixel signal SIG (that is, reset level), the drain voltage of the comparison transistor 323 (that is, first-stage output signal OUT) is inverted from the low level to the high level. Since the clamp transistor 325 is in a diode connection, the amplitude of the first-stage output signal OUT changes within a voltage range limited by the clamp transistor 325. This similarly applies to a conversion period at a signal level.

Subsequently, the level of the vertical signal line 269-$n$ changes to a signal level based on the amount of exposure. In the conversion period at the signal level from timings T4 to T6, the DAC 220 gradually reduces the reference signal RMP. At a timing T5 at which the reference signal RMP reaches a value equal to or less than the level of the pixel signal SIG (that is, signal level), the first-stage output signal OUT is inverted from the low level to the high level.

As described above, the sources of both of the comparison transistor 323 on the first stage and the amplification transistor 332 on the second stage are connected to the vertical signal line 269-$n$. Thus, the level of the reference signal at the time of inversion of the output of each of the first and second stages (comparison result) takes a value obtained by adding the level of the vertical signal line 269-$n$ and the threshold voltage of the nMOS transistor (comparison transistor 323 or the like) together. In this way, the level of the reference signal at the time of inversion of a comparison result follows the level of the vertical signal line 269-$n$. With this, the satisfactory linearity characteristics of the inversion timing with respect to the amount of exposure is achieved.

Moreover, the capacitor 321 for bandlimiting is provided to suppress noise generated by the comparator 300, and the capacitor 321 is placed between the vertical signal line 269-$n$ and the first stage. Since the amplitude of the first-stage output signal OUT changes only within the voltage range limited by the clamp transistor 325 as described above, the amount of charge or discharge of the capacitor 321 is not affected by the amount of exposure. Thus, the linearity characteristics can be improved.

Figure 9A:
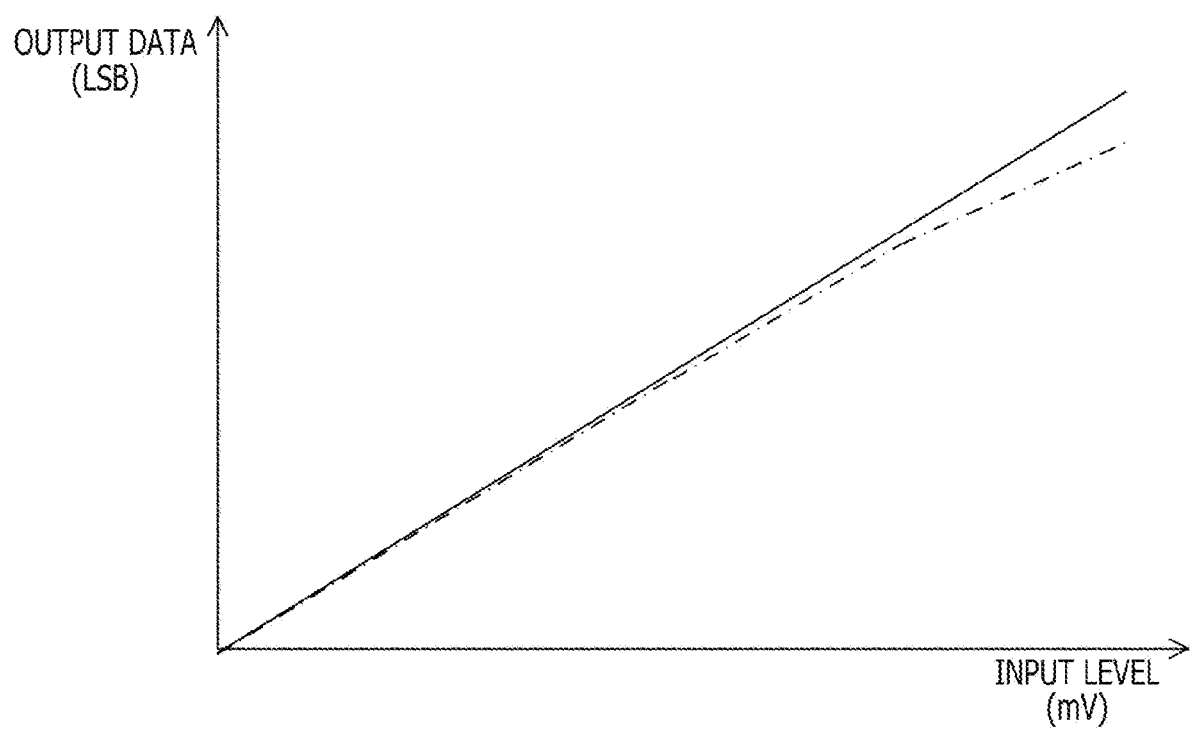
FIGS. 9A and 9B illustrate graphs depicting exemplary input/output characteristics of an ADC according to the first embodiment of the present technology.
Figure 9B:
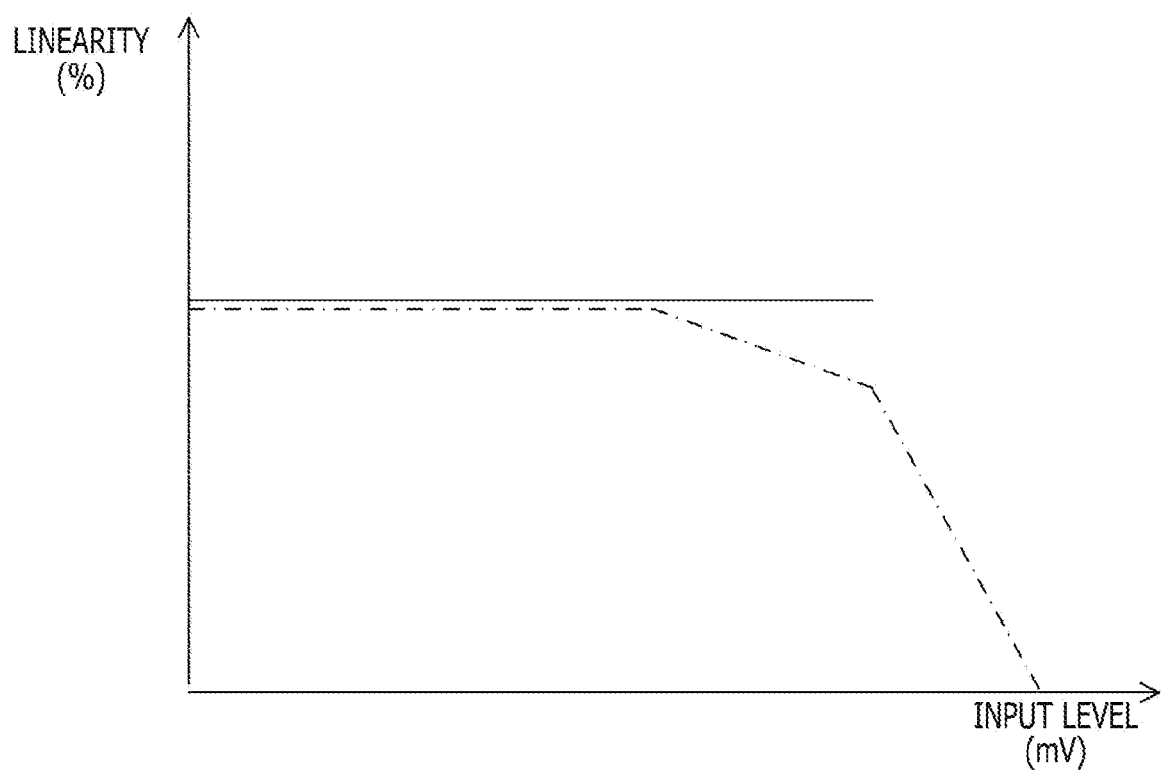

FIGS. 9A and 9B illustrate graphs depicting exemplary input/output characteristics of the ADC 271 according to the first embodiment of the present technology. In the figure, FIG. 9A is a graph depicting an exemplary relation between the input level of the ADC 271 and output data. The vertical axis of FIG. 9A of the figure indicates the output data that is a digital signal output from the ADC 271, and the horizontal axis of FIG. 9A of the figure indicates the input level that is the level of a pixel signal input to the ADC 271. In the figure, FIG. 9B is a graph depicting exemplary linearity characteristics of the ADC 271. In FIG. 9B, the vertical axis indicates the error with respect to ideal linearity characteristics of the ADC 271, and the horizontal axis indicates the input level. Further, solid lines of the figure indicate the characteristics of the ADC 271 using the comparison transistor 323 (that is, nMOS transistor), and long dashed short dashed lines of the figure indicate the comparative example using the pMOS transistor.

As exemplified in FIGS. 9A and 9B, in the comparative example, as the input level increases, the linearity characteristics deteriorate, and the trajectory thus bends. In contrast to this, the ADC 271 achieves satisfactory linearity characteristics over a wide range.

In this way, according to the first embodiment of the present technology, since the comparison transistor having the source connected to the constant current source 273, the gate to which the reference signal is input, and the drain from which comparison results are output is provided, there is no need to insert a pMOS transistor for a comparison to the vertical signal line. Thus, the amplitude can be increased as compared to the case where the pMOS transistor is inserted, with the result that the dynamic range can be expanded.

FIRST MODIFIED EXAMPLE

Although the circuits in the solid-state imaging element 200 are provided on the single semiconductor chip in the first embodiment described above, this configuration is difficult to miniaturize since the circuit scale is increased along with an increase in number of pixels. The solid-state imaging element 200 according to a first modified example of the first embodiment is different from the first embodiment in that a plurality of semiconductor chips is stacked to reduce the circuit scale of each chip.

Figure 10:
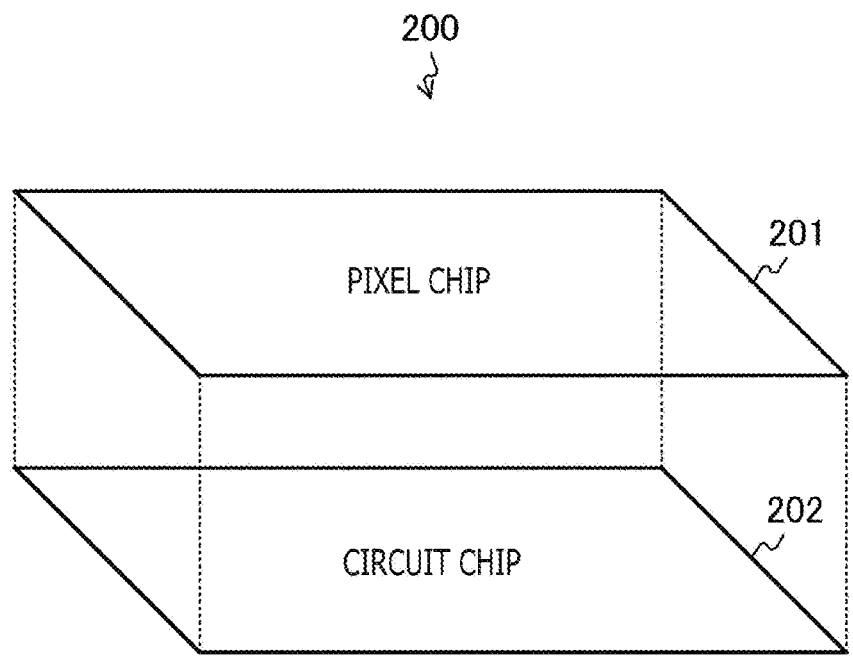
FIG. 10 is a diagram depicting an exemplary stacked structure of a solid-state imaging element according to a first modified example of the first embodiment of the present technology.

FIG. 10 is a diagram depicting an exemplary stacked structure of the solid-state imaging element 200 according to the first modified example of the first embodiment of the present technology. The solid-state imaging element 200 of the first modified example includes a circuit chip 202 and a pixel chip 201 stacked on the circuit chip 202. Those boards are electrically connected to each other through connection portions such as vias. It is to be noted that the boards can also be connected to each other through, other than vias, Cu—Cu bonding, bumps, or an inductive coupling communication technology such as TCI (ThruChip Interface).

Figure 11:
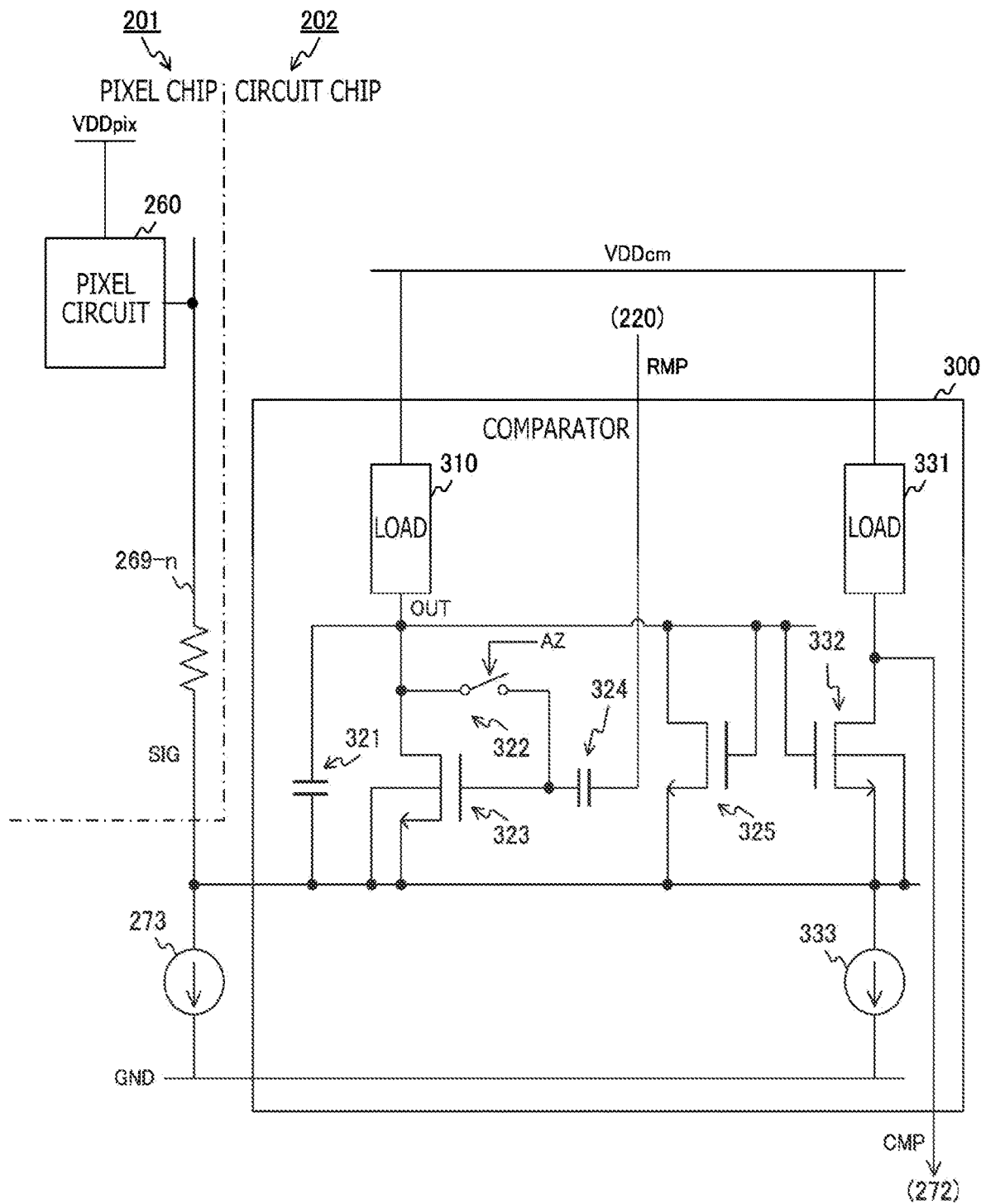
FIG. 11 is a circuit diagram depicting configuration examples of a pixel circuit and a comparator according to the first modified example of the first embodiment of the present technology.

FIG. 11 is a circuit diagram depicting configuration examples of the pixel circuit 260 and the comparator 300 according to the first modified example of the first embodiment of the present technology. In the first modified example, the pixel circuit 260 is provided on the pixel chip 201, and the comparator 300 and the subsequent circuits are provided on the circuit chip 202.

Further, the comparator 300 has a power supply voltage VDDcm separated from the power supply voltage VDDpix of the pixel circuit 260. It is to be noted that, while all the parts of the comparator 300 are placed on the circuit chip 202, which circuit is placed on which chip is not limited to the example depicted in the figure.

Figure 12:
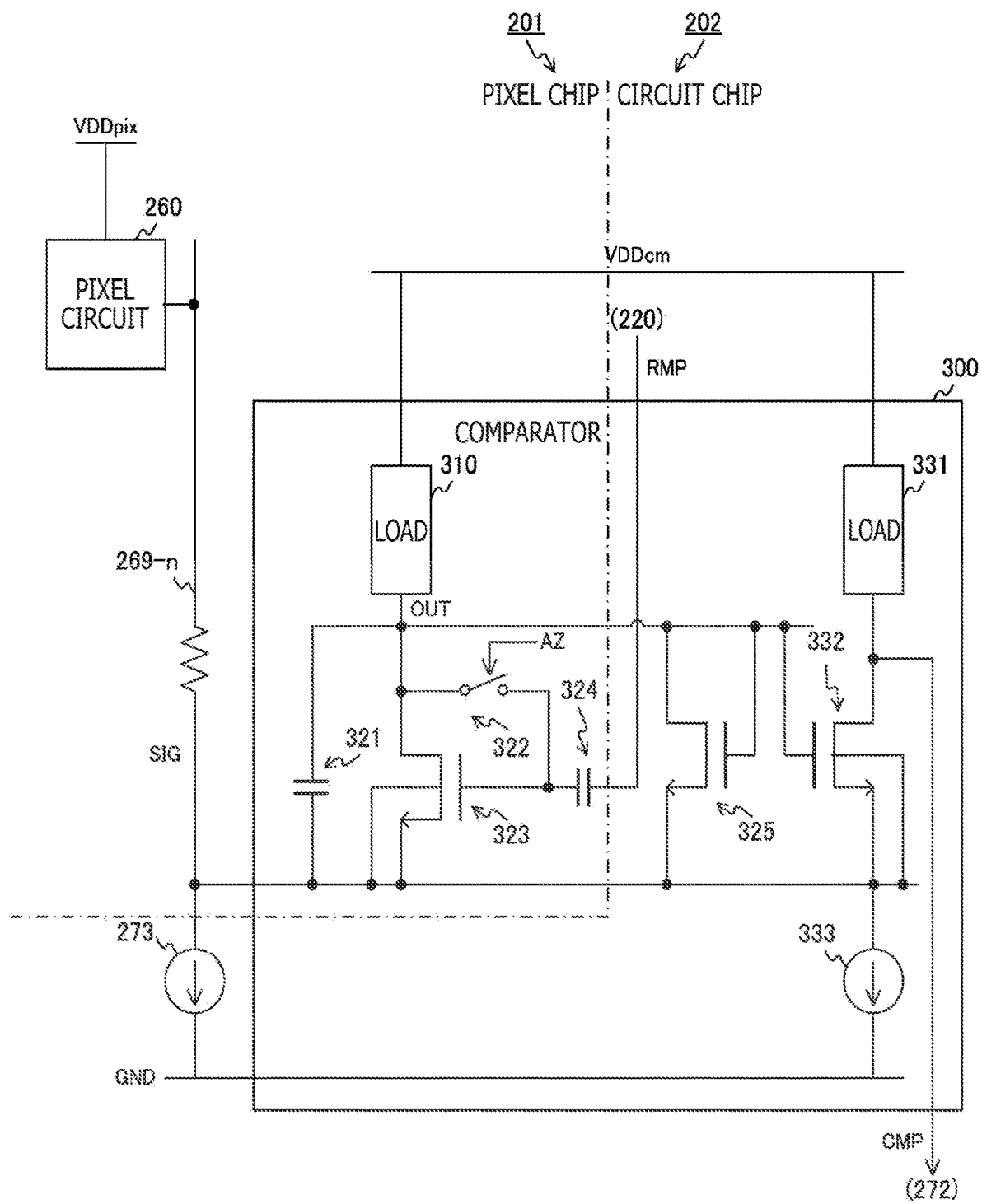
FIG. 12 is a circuit diagram depicting an example in which the stacked structure according to the first modified example of the first embodiment of the present technology is modified.
Figure 13:
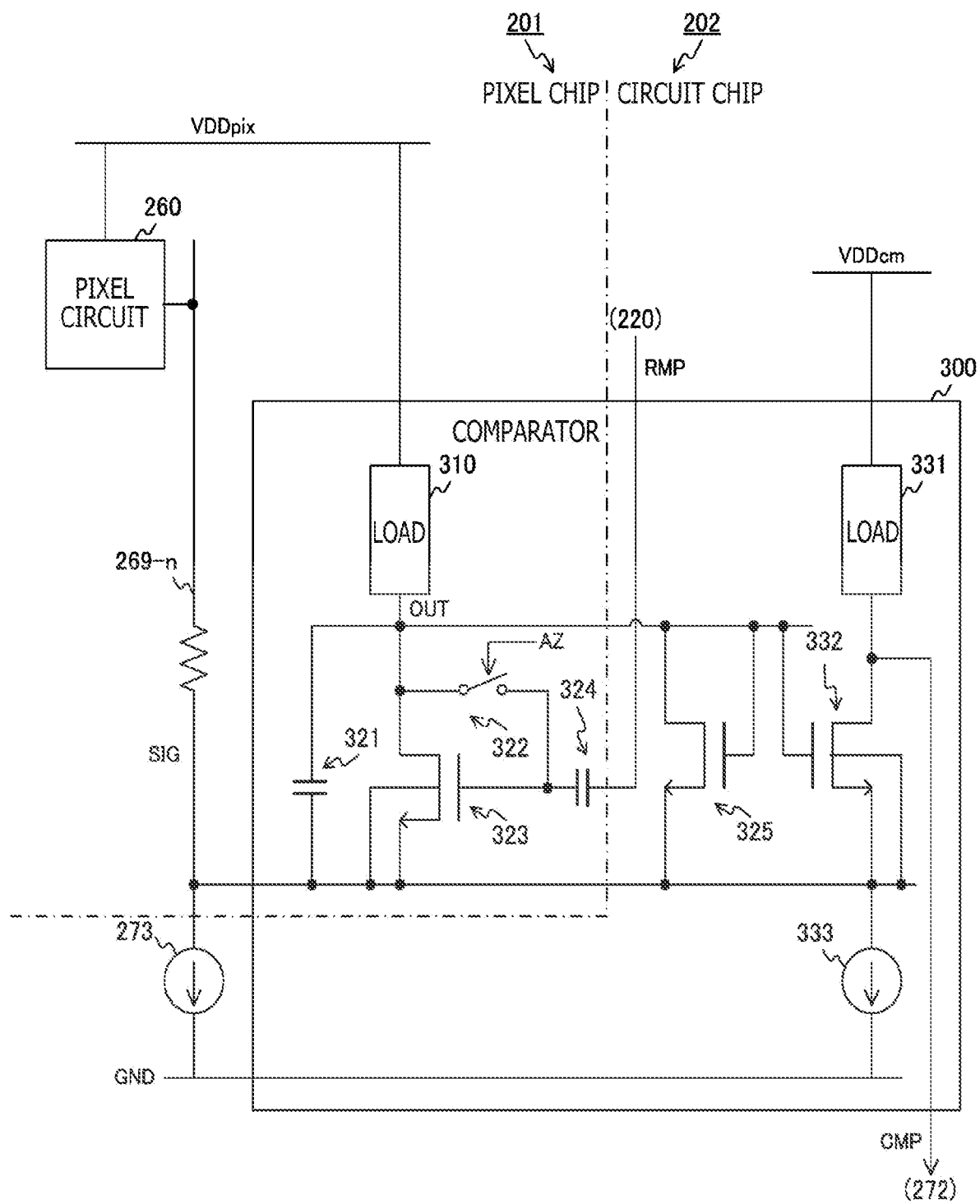
FIG. 13 is a circuit diagram in which the stacked structure and a power supply separation method according to the first modified example of the first embodiment of the present technology are modified.

For example, as exemplified in FIG. 12, the parts on the stages preceding to the clamp transistor 325 can also be placed on the pixel chip 201, and the clamp transistor 325 and the subsequent parts can also be placed on the circuit chip 202. In this case, the circuits in the comparator 300 that are incorporated in part of the pixel chip 201 may have a power supply voltage same as that of the remaining, namely, VDDcm, as exemplified in FIG. 12 or a power supply voltage separated from that of the remaining, namely, VDDpix, as exemplified in FIG. 13.

Figure 14:
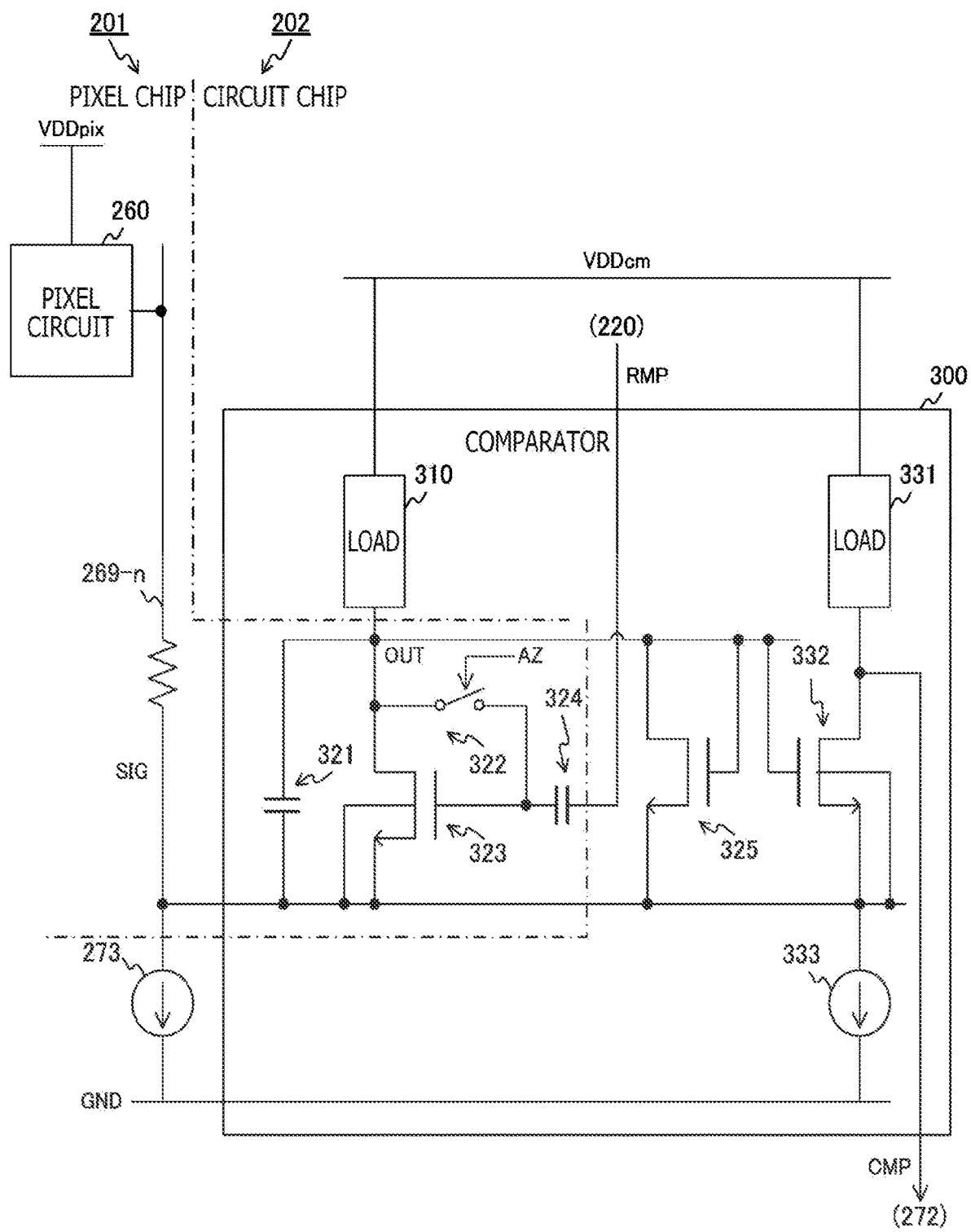
FIG. 14 is a circuit diagram depicting an example in which the stacked structure according to the first modified example of the first embodiment of the present technology is further modified.

Alternatively, as exemplified in FIG. 14, the clamp transistor 325 and the subsequent parts and the load 310 can also be placed on the circuit chip 202.

With the comparator 300 at least some parts of which are placed on the circuit chip 202 in a distributed manner as exemplified in FIG. 11 to FIG. 14, the circuit scale of each chip can be reduced.

In this way, according to the first modified example of the first embodiment of the present technology, since the pixel circuit 260, the comparator 300, and the like are placed on the pixel chip 201 and the circuit chip 202, which are stacked, in a distributed manner, the circuit scale of each chip can be reduced.

Second Modified Example

Although the ADC 271 is placed in each column in the first modified example of the first embodiment described above, with this configuration, it is difficult to enhance the speed of AD conversion of pixel signals (in other words, reading speed). The solid-state imaging element 200 according to a second modified example of the first embodiment is different from the first modified example of the first embodiment in that an ADC is placed in each pixel to enhance the reading speed.

Figure 15:
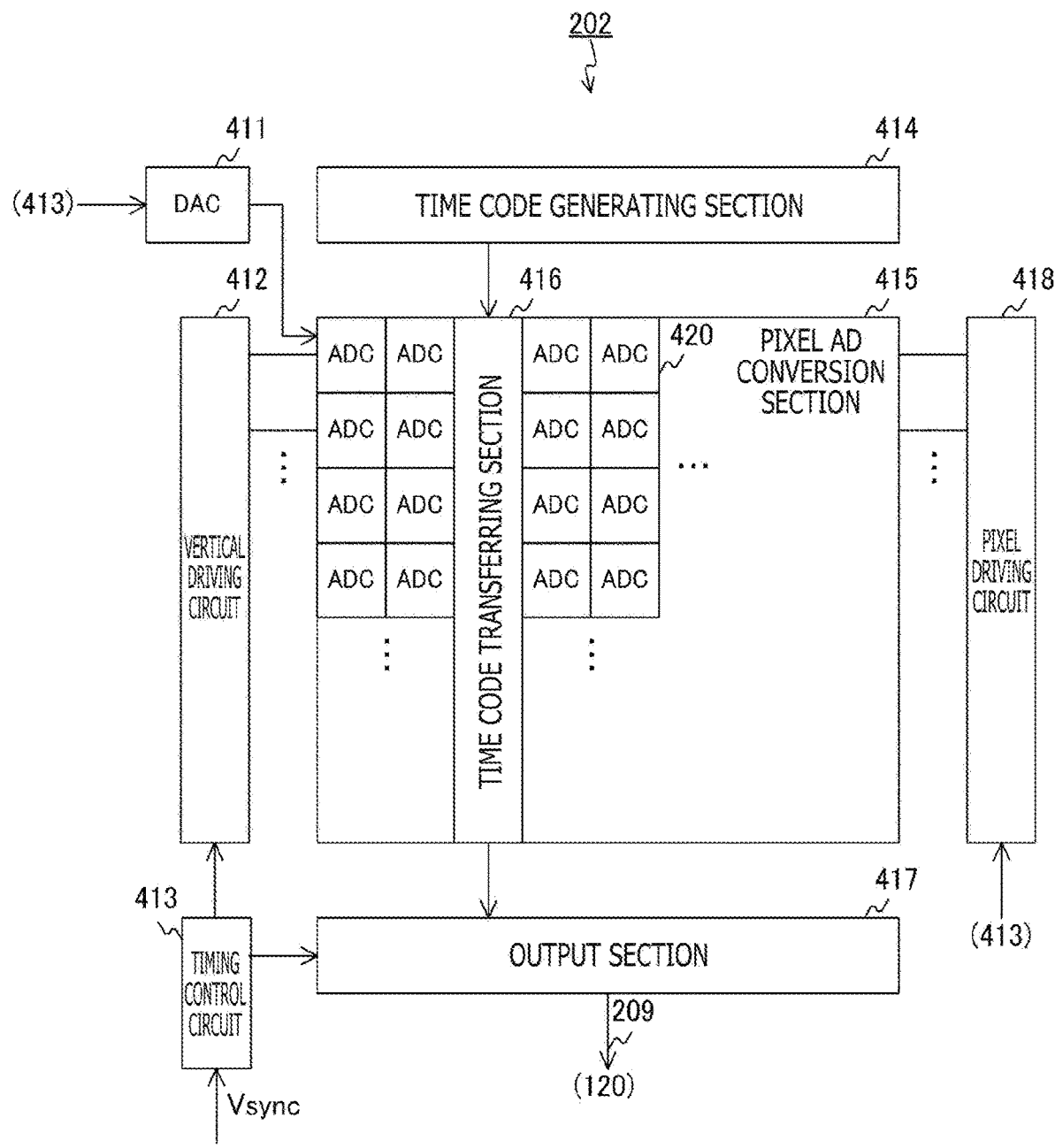
FIG. 15 is a block diagram depicting a configuration example of a circuit chip according to a second modified example of the first embodiment of the present technology.

FIG. 15 is a block diagram depicting a configuration example of the circuit chip 202 according to the second modified example of the first embodiment of the present technology. On the circuit chip 202 of the second modified example, a DAC 411, a vertical driving circuit 412, a timing control circuit 413, a time code generating section 414, a pixel AD conversion section 415, an output section 417, and a pixel driving circuit 418 are placed.

In the pixel AD conversion section 415, a plurality of ADCs 420 and a time code transferring section 416 are placed. The ADC 420 is provided for each of the pixel circuits 260. The ADC 420 converts pixel signals from the corresponding pixel circuit 260 to digital signals and transfers the digital signals to the time code transferring section 416. A circuit including the ADC 420 and the corresponding pixel circuit 260 functions as a single pixel. That is, the ADC 420 is placed in each pixel.

The time code transferring section 416 transfers time codes from the time code generating section 414 to the ADC 420 and transfers digital signals from the ADC 420 to the output section 417. The time code transferring section 416 is placed in every four columns of the ADCs 420, for example.

The DAC 411 generates a reference signal through a DA conversion and supplies the reference signal to the pixel AD conversion section 415. The vertical driving circuit 412 drives the ADCs 420 in a predetermined order to cause the ADCs 420 to output digital signals.

The time code generating section 414 generates time codes. A time code indicates a time in a period in which the reference signal changes in a sloped manner. The time code generating section 414 supplies the generated time codes to the time code transferring section 416.

The output section 417 executes signal processing such as CDS processing on digital signals from the time code transferring section 416 and supplies the signals to the DSP circuit 120. The pixel driving circuit 418 drives the pixel circuits 260 in a predetermined order.

With the ADC 420 provided in each pixel as exemplified in the figure, the reading speed can be enhanced as compared to the first modified example of the first embodiment in which the ADC 271 is provided in each column.

Figure 16:
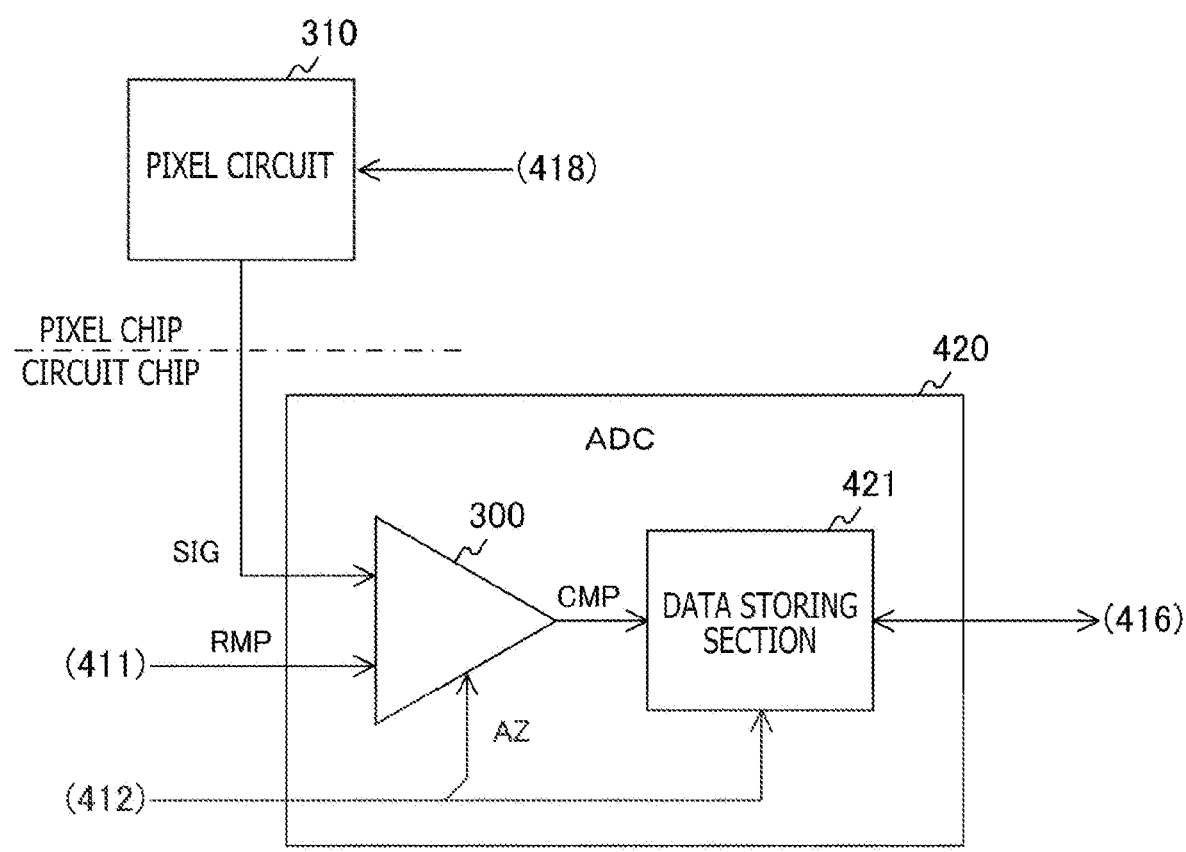
FIG. 16 is a block diagram depicting a configuration example of an ADC according to the second modified example of the first embodiment of the present technology.

FIG. 16 is a block diagram depicting a configuration example of the ADC 420 according to the second modified example of the first embodiment of the present technology. The ADC 420 of the second modified example includes the comparator 300 and a data storing section 421.

The comparator 300 according to the second modified example of the first embodiment has a configuration similar to that of the first modified example. The comparator 300 supplies the comparison result signal CMP to the data storing section 421.

The data storing section 421 stores a time code at which the comparison result signal CMP has been inverted. The data storing section 421 receives time codes from the time code transferring section 416 and stores, as a digital signal after an AD conversion, a time code at which the comparison result signal CMP has been inverted. Then, the data storing section 421 supplies the digital signal to the time code transferring section 416 under the control of the vertical driving circuit 412.

In this way, according to the second modified example of the first embodiment of the present technology, since the ADC 420 is provided in each pixel, the reading speed can be enhanced as compared to the case where the ADC is provided in each column.

Third Modified Example

While the vertical signal line and the ADC 271 are connected to each other on a one-to-one basis in the first embodiment described above, a plurality of vertical signal lines and the ADC 271 can also be connected to each other. A third modified example of the first embodiment is different from the first embodiment in that a plurality of vertical signal lines and the ADC 271 are connected to each other.

Figure 17:
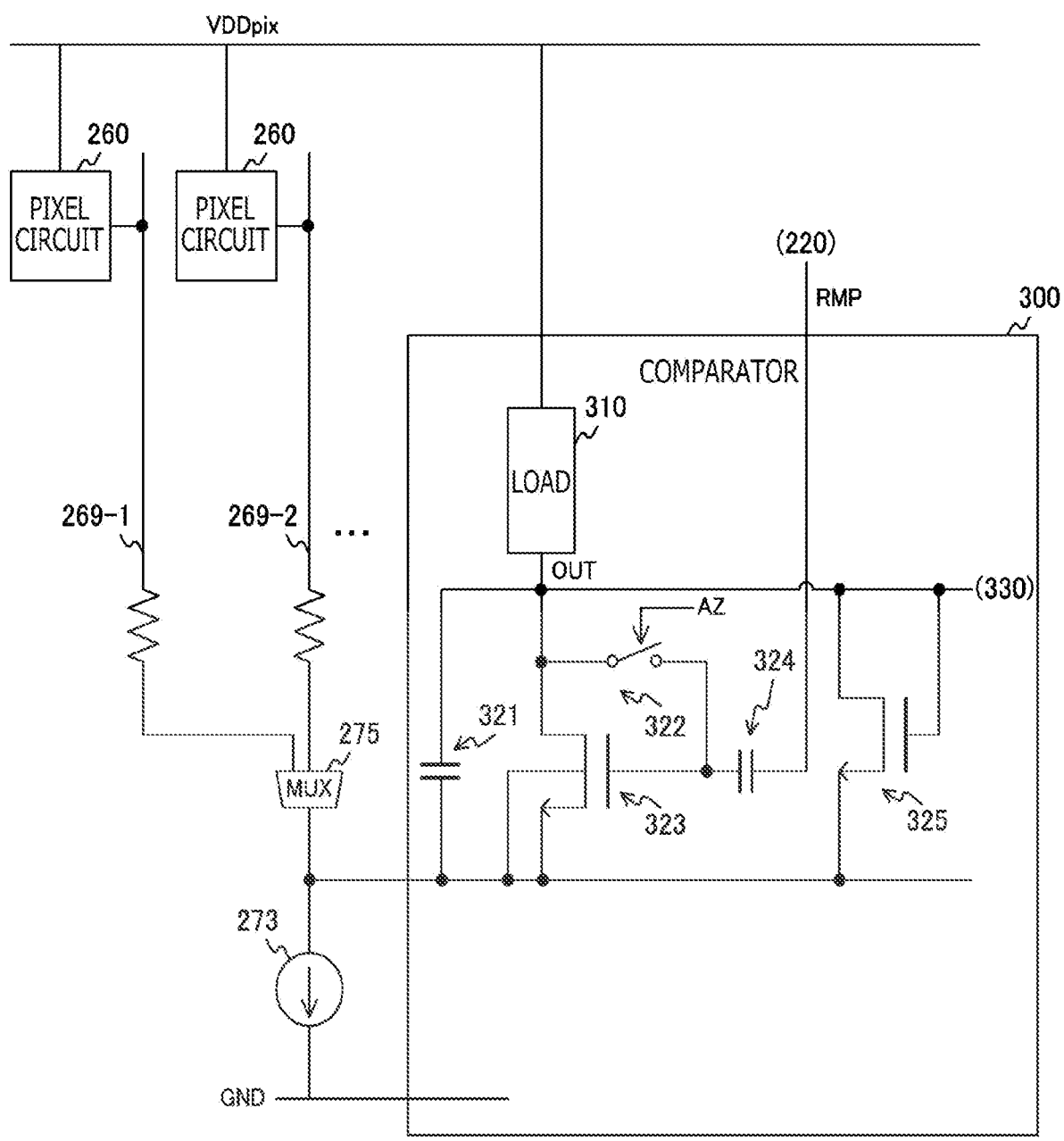
FIG. 17 is a block diagram depicting a configuration example of an ADC according to a third modified example of the first embodiment of the present technology.

FIG. 17 is a block diagram depicting a configuration example of the ADC 271 according to the third modified example of the first embodiment of the present technology. The ADC 271 according to the third modified example of the first embodiment is different from the first embodiment in further including a multiplexer 275.

The multiplexer 275 is connected to a plurality of vertical signal lines. For example, the multiplexer 275 is connected to K vertical signal lines such as vertical signal lines 261 and 262. The multiplexer 275 connects any of the K vertical signal lines to the input terminal of the comparator 300 under the control of the timing control circuit 230.

In this way, according to the third modified example of the first embodiment of the present technology, since the plurality of vertical signal lines and the ADC 271 are connected to each other, the number of the ADCs 271 can be reduced as compared to the case where the ADC 271 is provided for each vertical signal line.

2. Second Embodiment

Although the amplification transistor 332 configured to amplify voltage signals and the like are provided in the amplifier circuit 330 on the second stage in the first embodiment described above, in this configuration, it is difficult to reduce the power supply voltage. The comparator 300 of a second embodiment is different from the first embodiment in including a TIA (Trans Impedance Amplifier) to reduce the power supply voltage.

FIG. 16 is a circuit diagram depicting a configuration example of the comparator 300 according to the second embodiment of the present technology. The comparator 300 of the second embodiment is different from the first embodiment in that the clamp transistor 325 is not placed and a TIA 334 is provided in the amplifier circuit 330. Further, from the drain of the comparison transistor 323 of the second embodiment, a current signal is output as the first-stage output signal OUT.

The TIA 334 converts the first-stage output signal OUT (current signal) to a voltage signal and outputs the voltage signal as the comparison result signal CMP. Since current is output from the first stage, the output amplitude of the first stage can be reduced as compared to the first embodiment in which voltage is output from the first stage, and the power supply voltage can therefore be reduced.

It is to be noted that the first modified example or second modified example of the first embodiment is applicable to the second embodiment.

In this way, according to the second embodiment of the present technology, since the comparison transistor 323 outputs current signals and the TIA 334 converts the current signals to voltage signals, the output amplitude of the first stage can be reduced as compared to the case where the comparison transistor 323 on the first stage outputs voltage signals. With this, the power supply voltage can be reduced.

3. Third Embodiment

Although a potential drop due to the vertical signal line 269-n is constant in the first embodiment described above, in this configuration, it is difficult to further reduce noise. The comparator 300 of a third embodiment is different from the first embodiment in that variable resistors are inserted to reduce noise.

FIG. 17 is a circuit diagram depicting a configuration example of the comparator 300 according to the third embodiment of the present technology. The comparator 300 of the third embodiment is different from the first embodiment in further including variable resistors 274 and 340.

The variable resistor 274 is inserted to the vertical signal line 269-n. A connection node between the variable resistor 274 and the constant current source 273 is connected to the source of the comparison transistor 323. Further, the variable resistor 340 is inserted between the clamp transistor 325 and the source of the comparison transistor 323.

The circuit outside the solid-state imaging element 200 (DSP circuit 120 or the like) measures brightness on the basis of image data, for example, and controls resistance values of the variable resistors 274 and 340 depending on the brightness. For example, the DSP circuit 120 sets a smaller resistance value for higher brightness and a larger resistance value for lower brightness. With this control, the amplitude of a pixel signal is adjusted.

Since an analog gain with respect to pixel signals is set larger for lower brightness, a larger resistance value is set for lower brightness, so that the amplitude of a pixel signal that is transmitted through the vertical signal line 269-n can be reduced, and the operating range of the comparator 300 can therefore be increased. With this, pixel signal noise can be reduced.

Figure 18:
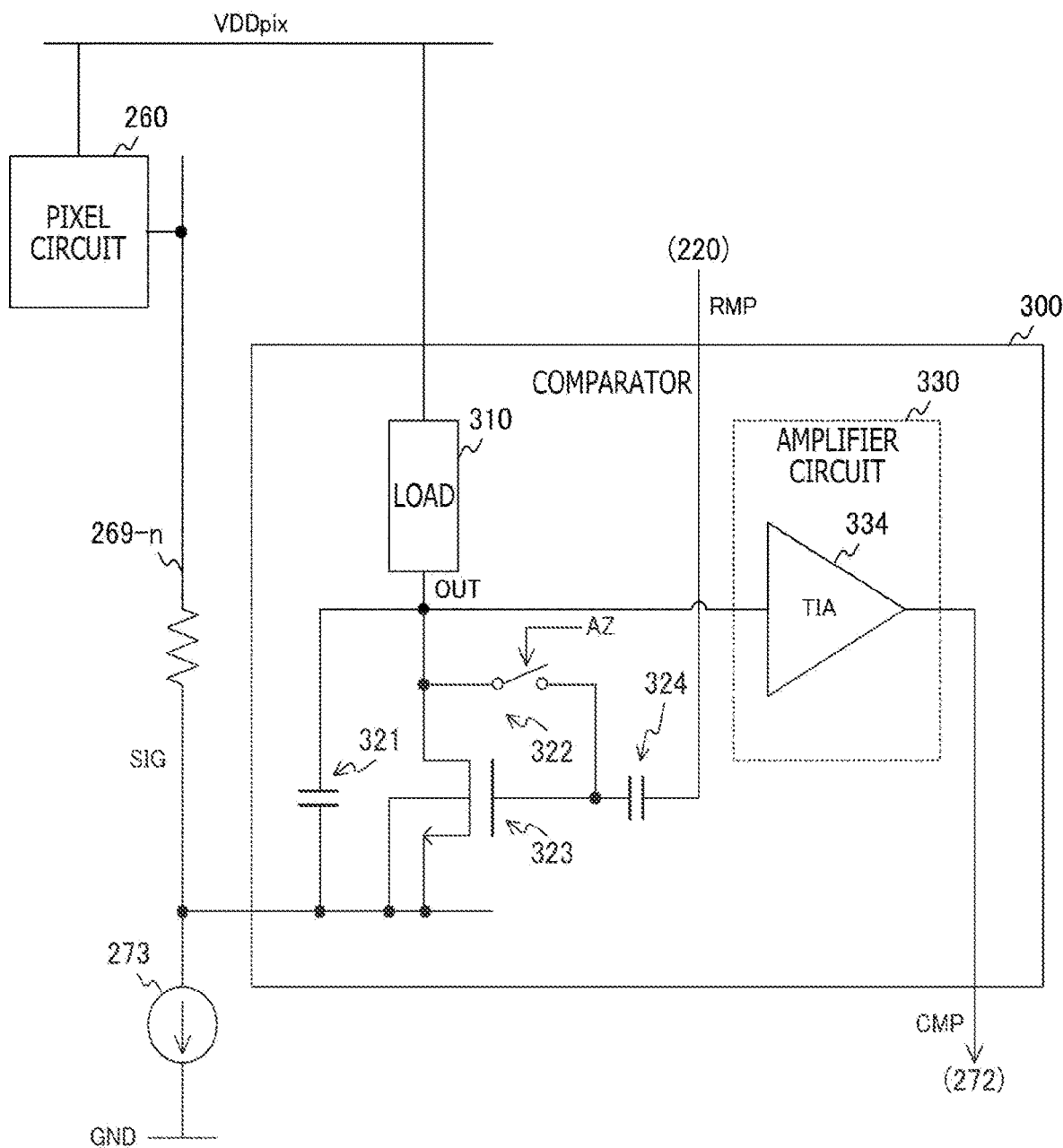
FIG. 18 is a circuit diagram depicting a configuration example of a comparator according to a second embodiment of the present technology.

FIG. 18 illustrates circuit diagrams depicting configuration examples of the variable resistor 340 according to the third embodiment of the present technology. In the figure, a is a circuit diagram of the variable resistor 340 using an nMOS transistor, b is a circuit diagram of the variable resistor 340 using a pMOS transistor, and c is a circuit diagram of the variable resistor 340 using the nMOS transistor and the pMOS transistor. The variable resistor 274 has a circuit configuration similar to that of the variable resistor 340.

As exemplified in a of the figure, an nMOS transistor 341 can be used as the variable resistor 340. The resistance value of the nMOS transistor 341 is controlled by the bias voltage Vb that is applied to the gate of the nMOS transistor 341.

Further, as exemplified in b of the figure, a pMOS transistor 342 can be used as the variable resistor 340. The resistance value of the pMOS transistor 342 is controlled by the bias voltage Vb that is applied to the gate of the pMOS transistor 342.

Further, as exemplified in c of the figure, the nMOS transistor 341 and the pMOS transistor 342 that are connected in parallel can be used as the variable resistor 340. The resistance values of those transistors are controlled by the bias voltage Vb that is applied to the p-side gate and a bias voltage Vb' that is applied to the n-side gate.

Figure 19:
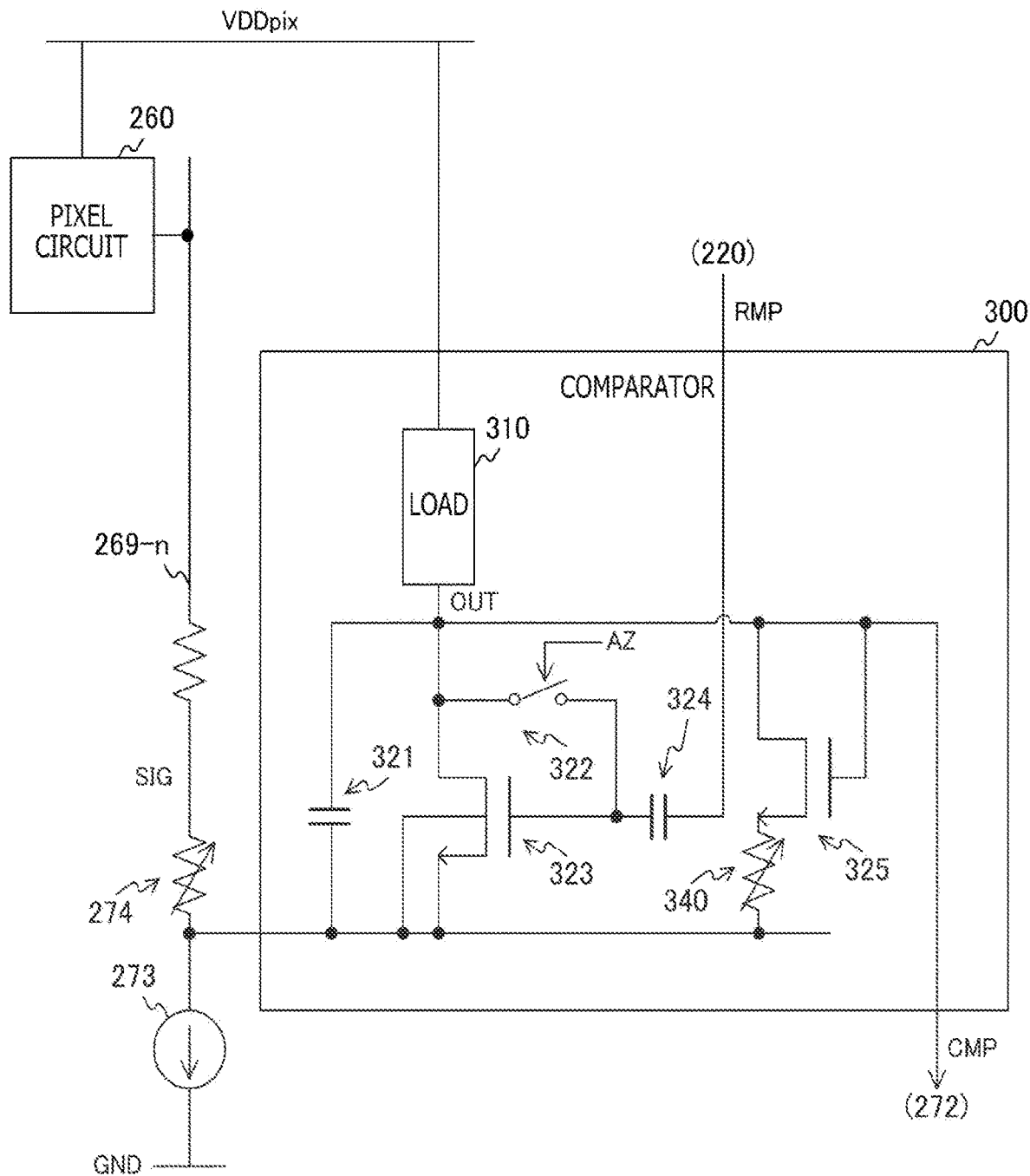
FIG. 19 is a circuit diagram depicting a configuration example of a comparator according to a third embodiment of the present technology.

Further, as exemplified in a of FIG. 19, as the variable resistor 340, M (M is an integer) pairs of a switch 343 and a resistor 344 can also be used. The multiple resistors 344 have respective one ends connected, in common, to one of the power supply side and the ground side of the variable resistor 340, and the respective other ends connected to the corresponding switches 343. The switch 343 has one end connected to the corresponding resistor 344 and the other end connected to the other of the power supply side and ground side of the variable resistor 340. The m-th (m is an integer of from 1 to M) switch 343 is controlled by a control signal SWm.

The timing control circuit 230 controls, under the control of the DSP circuit 120 or the like, the number of the resistors 344 to be connected in parallel, by the control signal SWm.

Further, as exemplified in b of FIG. 19, a switched capacitor can also be used as the variable resistor 340. In this switched capacitor, for example, switches 345 and 347 and a capacitor 346 are provided. The switch 345 opens or closes a path between the power supply side of the variable resistor 340 and one end of the capacitor 346 according to a control signal SWa, and the switch 347 opens or closes a path between the ground side of the variable resistor 340 and one end of the capacitor 346 according to a control signal SWb.

The timing control circuit 230 controls, under the control of the DSP circuit 120 or the like, the switching operation of the switched capacitor by the control signals SWa and SWb. An impedance Z of the switched capacitor is expressed by the following expression where fs indicates the switching frequency and C indicates the capacitance value of the capacitor 346.

$$Z=1/(fs \cdot C)$$

It is to be noted that the first modified example or second modified example of the first embodiment is applicable to the third embodiment. Further, the second embodiment is also applicable to the third embodiment.

In this way, according to the third embodiment of the present technology, since the amplitude of a pixel signal is adjusted by the variable resistor 340 depending on brightness, a smaller amplitude can be set for higher brightness, and the operating range of the comparator 300 can therefore be expanded. With this, pixel signal noise can be reduced.

<4. Application Example to Mobile Body>

The technology according to the present disclosure (present technology) is applicable to various products. For example, the technology according to the present disclosure may be realized as a device that is mounted on any type of mobile body such as an automobile, an electric vehicle, a hybrid electric vehicle, a motorcycle, a bicycle, a personal mobility, an airplane, a drone, a ship, or a robot.

Figure 20A:
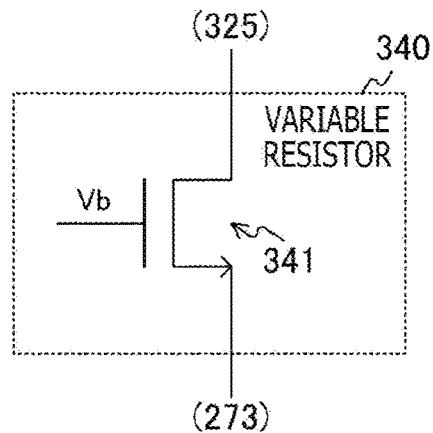
FIGS. 20A, 20B, and 20C illustrate circuit diagrams depicting configuration examples of a variable resistor according to the third embodiment of the present technology.
Figure 20B:
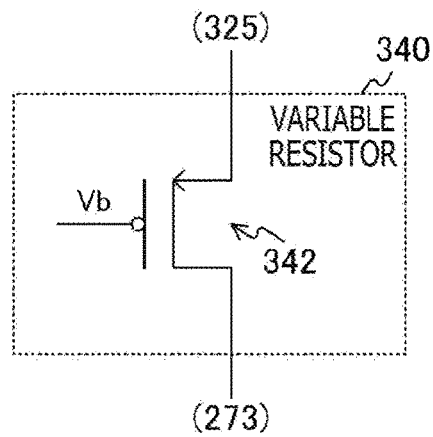
Figure 20C:
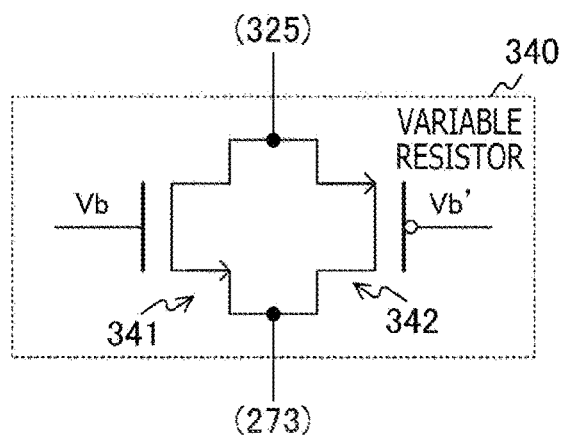

FIGS. 20A, 20B, and 20C are block diagrams depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIGS. 20A, 20B, and 20C, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIGS. 20A, 20B, and 20C, an audio speaker 12061, a display section 12062, and an instrument panel 12063 are illustrated as the output device. The display section 12062 may, for example, include at least one of an on-board display and a head-up display.

Figure 21A:
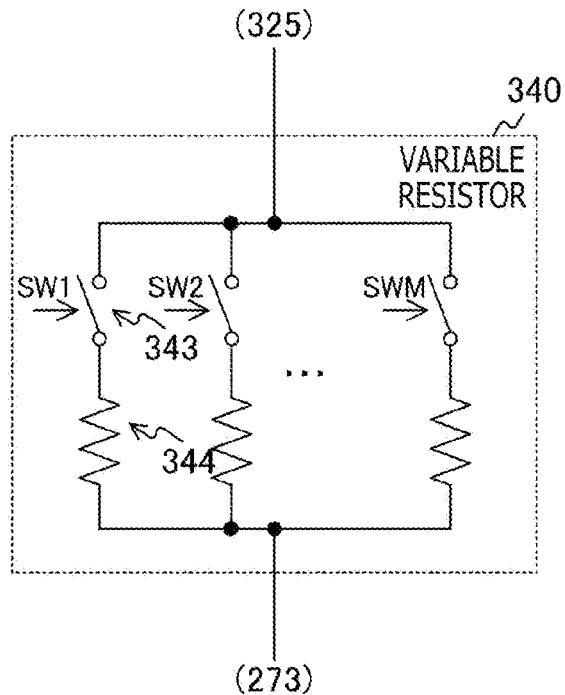
FIGS. 21A and 21B illustrate circuit diagrams depicting other examples of the variable resistor according to the third embodiment of the present technology.
Figure 21B:
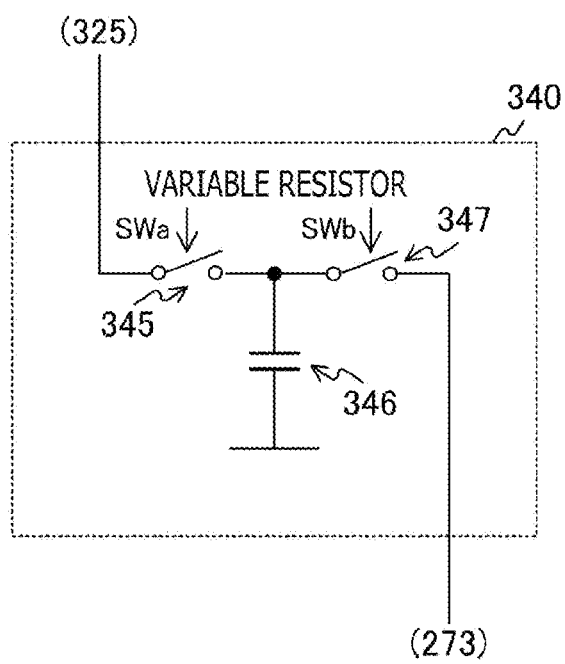
Figure 22:
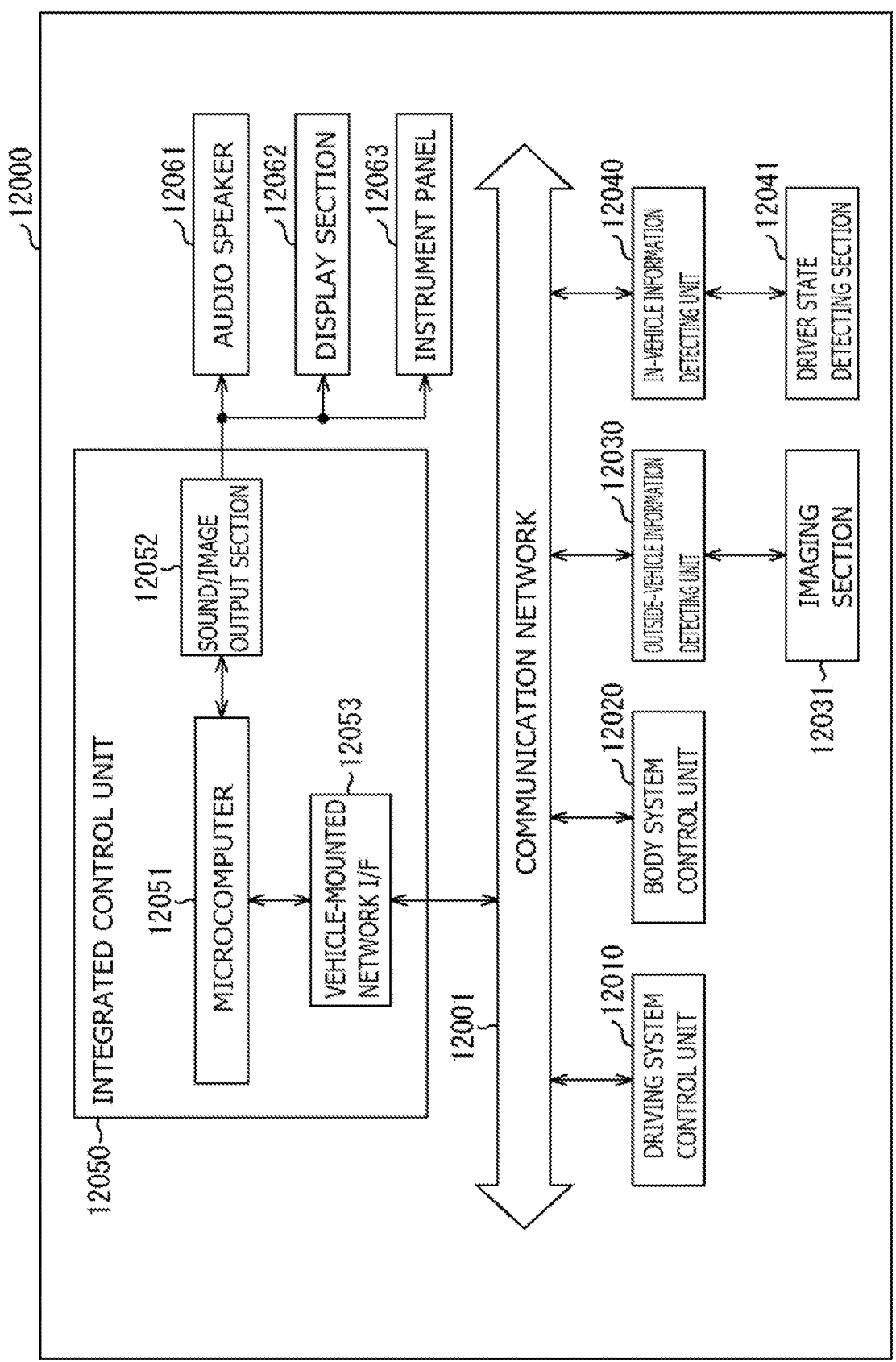
FIG. 22 is a block diagram depicting an example of schematic configuration of a vehicle control system.
Figure 23:
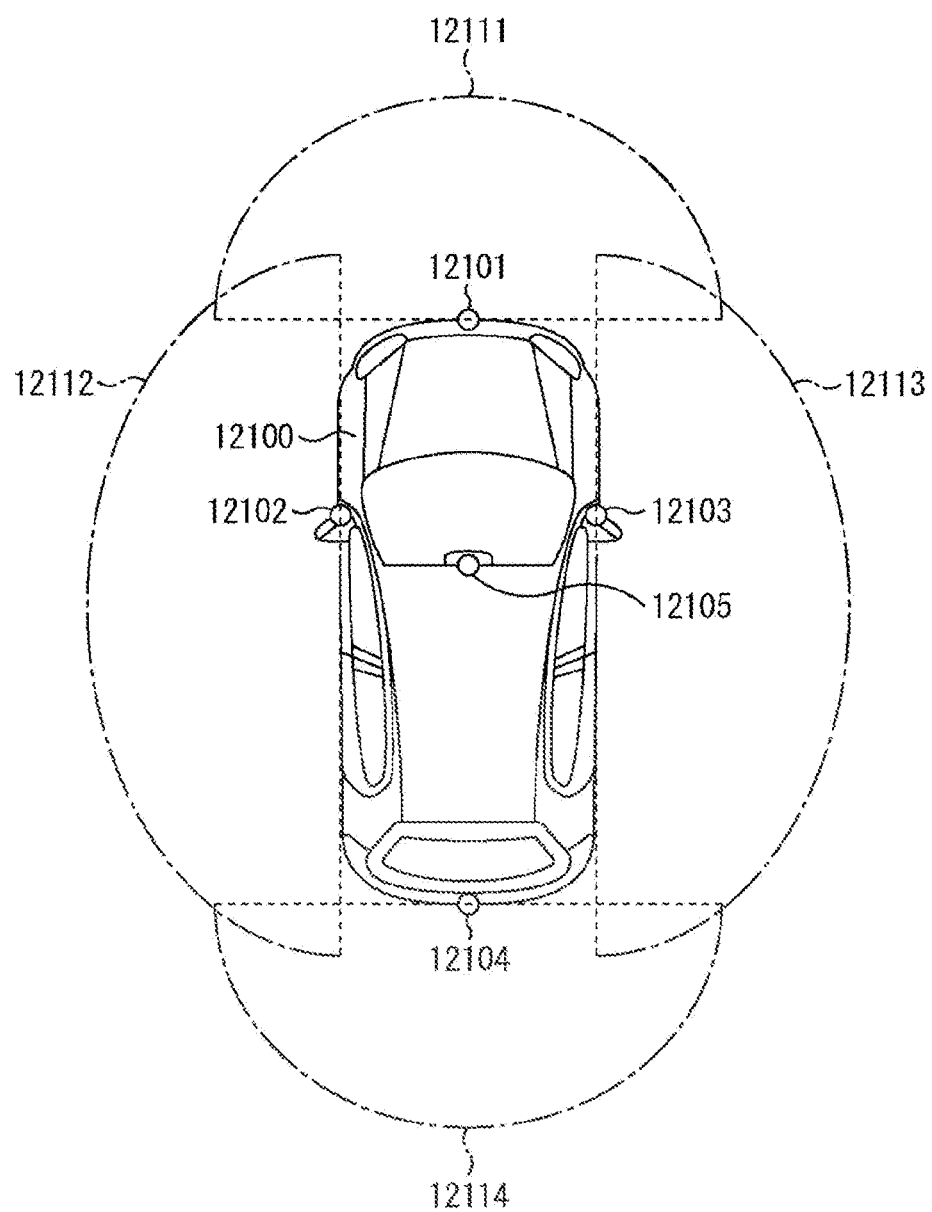
FIG. 23 is a diagram of assistance in explaining an example of installation positions of an outside-vehicle information detecting section and an imaging section.

FIGS. 21A and 21B are diagrams depicting an example of the installation position of the imaging section 12031.

In FIGS. 21A and 21B, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIGS. 21A and 21B depict an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 among the above-mentioned configurations, for example. Specifically, for example, the imaging device 100 of FIG. 1 is applicable to the imaging section 12031. With the application of the technology according to the present disclosure to the imaging section 12031, the dynamic range can be expanded, and captured images with higher visibility can thus be obtained, so that driver fatigue can be reduced.

It is to be noted that the above-mentioned embodiments are examples for embodying the present technology, and the matters in the embodiments have correspondence relations with respective matters to define the invention in the claims. In a similar manner, the matters to define the invention in the claims have correspondence relations with the respective matters in the embodiments of the present technology denoted by the names same as the respective matters. However, the present technology is not limited to the embodiments, and various modifications of the embodiments can be implemented without departing from the gist of the present technology.

It is to be noted that the effects described herein are only exemplary and not limitative, and other effects may be provided.

It is to be noted that the present technology can also adopt following configurations.

(1) A solid-state imaging element including:

a pixel circuit configured to generate a pixel signal and output the pixel signal to a vertical signal line; and a comparison transistor having a source connected to a constant current source configured to supply a constant current to the vertical signal line, a gate to which a predetermined reference signal is input, and a drain from which a comparison result between the pixel signal and the reference signal is output.

(2) The solid-state imaging element according to Item (1), further including:

a clamp transistor configured to limit an amplitude of a signal indicating the comparison result within a predetermined range.

(3) The solid-state imaging element according to Item (1) or (2), further including:

an amplifier circuit configured to amplify a signal indicating the comparison result.

(4) The solid-state imaging element according to Item (3), in which the amplifier circuit includes an amplification transistor configured to amplify a voltage signal indicating the comparison result, and the comparison transistor outputs the voltage signal.

(5) The solid-state imaging element according to Item (3), in which the amplifier circuit includes a transimpedance amplifier configured to convert a current signal indicating the comparison result to a voltage signal, and the comparison transistor outputs the current signal.

(6) The solid-state imaging element according to any one of Items (1) to (5), further including:

a variable resistor configured to adjust an amplitude of the pixel signal.

(7) The solid-state imaging element according to Item (6), in which the variable resistor includes a transistor having a gate to which a bias voltage is applied.

(8) The solid-state imaging element according to Item (6), in which the variable resistor includes a pair of transistors connected in parallel.

(9) The solid-state imaging element according to Item (6), in which the variable resistor includes a predetermined number of resistors connected in parallel, and a switch configured to control the number of the resistors to be connected.

(10) The solid-state imaging element according to Item (6), in which the variable resistor includes a switched capacitor.

(11) The solid-state imaging element according to any one of Items (1) to (10), further including:

a load inserted between a power supply and the drain.

(12) The solid-state imaging element according to Item (11), in which the load includes a transistor having a gate to which a predetermined bias voltage is applied.

(13) The solid-state imaging element according to Item (11), in which the load includes a pair of transistors in a cascode connection.

(14) The solid-state imaging element according to Item (11), in which the load includes a super cascode circuit.

(15) The solid-state imaging element according to Item (11), in which the load includes a resistor.

(16) The solid-state imaging element according to any one of Items (1) to (15), further including:

a capacitor connected to the drain and the source.

(17) The solid-state imaging element according to any one of Items (1) to (16), in which the pixel circuit is provided on a predetermined pixel chip, at least a part of a comparator including the comparison transistor is provided on a circuit chip different from the pixel chip, and the pixel circuit has a power supply separated from a power supply of the comparator.

(18) The solid-state imaging element according to any one of Items (1) to (17), in which the pixel circuit is provided in each pixel of a plurality of pixels arrayed in a two-dimensional lattice pattern in a pixel array section, the vertical signal line is formed in each column of the pixel array section, and the comparison transistor is provided for each of the vertical signal lines.

(19) The solid-state imaging element according to any one of Items (1) to (17), in which the pixel circuit and the comparison transistor are provided in each pixel of a plurality of pixels arrayed in a two-dimensional lattice pattern.

(20) An imaging device including:

a pixel circuit configured to generate a pixel signal and output the pixel signal to a vertical signal line;

a comparison transistor having a source connected to a constant current source configured to supply a constant current to the vertical signal line, a gate to which a predetermined reference signal is input, and a drain from which a comparison result between the pixel signal and the reference signal is output; and a counter configured to generate a digital signal based on the comparison result.

REFERENCE SIGNS LIST

100: Imaging device
110: Optical section
120: DSP circuit
130: Display section
140: Operation section
150: Bus
160: Frame memory
170: Storage section
180: Power supply section
200: Solid-state imaging element
201: Pixel chip
202: Circuit chip
210: Vertical scanning circuit
220, 411: DAC
230, 413: Timing control circuit
240: Upper column signal processing section
250: Pixel array section
260: Pixel circuit
261: Photoelectric conversion element
262: Transfer transistor
263: Reset transistor
264: Floating diffusion layer
265, 332: Amplification transistor
266: Selection transistor
270: Lower column signal processing section
271, 420: ADC
272: Counter
273, 315, 333: Constant current source
274, 340: Variable resistor
275: Multiplexer
280: Image processing section
300: Comparator
310, 331: Load
311, 312, 314, 342: pMOS transistor
313: Differential amplifier circuit
316, 344: Resistor
321, 324, 346: Capacitor
322: Auto-zero switch
323: Comparison transistor
325: Clamp transistor
330: Amplifier circuit
334: TIA 341: nMOS transistor
343, 345, 347: Switch
412: Vertical driving circuit
414: Time code generating section
415: Pixel AD conversion section
416: Time code transferring section
417: Output section
418: Pixel driving circuit
421: Data storing section
12031: Imaging section

The invention claimed is:

1. A solid-state imaging element, comprising:
a pixel circuit configured to generate a pixel signal and output the pixel signal to a vertical signal line;
a constant current source configured to supply a constant current to the vertical signal line;
a comparison transistor that includes:
a source connected to the constant current source;
a gate configured to receive a reference signal; and
a drain configured to output a comparison result between the pixel signal and the reference signal; and
a capacitor connected to the drain of the comparison transistor and the source of the comparison transistor.

2. The solid-state imaging element according to claim 1, further comprising a clamp transistor configured to limit, within a specific range, an amplitude of a signal indicating the comparison result.

3. The solid-state imaging element according to claim 1, further comprising an amplifier circuit configured to amplify a signal indicating the comparison result.

4. The solid-state imaging element according to claim 3, wherein
the comparison transistor is configured to output a voltage signal indicating the comparison result, and
the amplifier circuit includes an amplification transistor configured to amplify the voltage signal indicating the comparison result.

5. The solid-state imaging element according to claim 3, wherein
the comparison transistor is configured to output a current signal indicating the comparison result, and
the amplifier circuit includes a transimpedance amplifier configured to convert the current signal to a voltage signal.

6. The solid-state imaging element according to claim 1, further comprising a variable resistor configured to adjust an amplitude of the pixel signal.

7. The solid-state imaging element according to claim 6, wherein the variable resistor includes a transistor having a gate configured to receive a bias voltage.

8. The solid-state imaging element according to claim 6, wherein the variable resistor includes a pair of transistors connected in parallel.

9. The solid-state imaging element according to claim 6, wherein the variable resistor includes:
a specific number of resistors connected in parallel; and
a switch configured to control connection of the specific number of the resistors.

10. The solid-state imaging element according to claim 6, wherein the variable resistor includes a switched capacitor.

11. The solid-state imaging element according to claim 1, further comprising a load between a power supply and the drain of the comparison transistor.

12. The solid-state imaging element according to claim 11, wherein the load includes a transistor having a gate configured to receive a specific bias voltage.

13. The solid-state imaging element according to claim 11, wherein the load includes a pair of transistors in a cascode connection.

14. The solid-state imaging element according to claim 11, wherein the load includes a super cascode circuit.

15. The solid-state imaging element according to claim 11, wherein the load includes a resistor.

16. The solid-state imaging element according to claim 1, further comprising:
a comparator including the comparison transistor;
a circuit chip; and
a pixel chip different from the circuit chip, wherein
the pixel circuit is on the pixel chip,
at least a part of the comparator is on the circuit chip, and
the pixel circuit has a power supply separated from a power supply of the comparator.

17. The solid-state imaging element according to claim 1, further comprising a pixel array section that includes a plurality of pixels in a two-dimensional lattice pattern, wherein
each pixel of the plurality of pixels includes the pixel circuit,
each column of the pixel array section includes the vertical signal line, and
the comparison transistor is for the vertical signal line of each column of the pixel array section.

18. The solid-state imaging element according to claim 1, further comprising a pixel array section that includes a plurality of pixels in a two-dimensional lattice pattern, wherein each pixel of the plurality of pixels includes the pixel circuit and the comparison transistor.

19. An imaging device, comprising:
a pixel circuit configured to generate a pixel signal and output the pixel signal to a vertical signal line;
a constant current source configured to supply a constant current to the vertical signal line;
a comparison transistor that includes:
a source connected to the constant current source;
a gate configured to receive reference signal; and
a drain configured to output a comparison result between the pixel signal and the reference signal;
a capacitor connected to the drain of the comparison transistor and the source of the comparison transistor; and
a counter configured to generate a digital signal based on the comparison result.

20. A solid-state imaging element, comprising:
a pixel circuit configured to generate a pixel signal and output the pixel signal to a vertical signal line;
a variable resistor configured to adjust an amplitude of the pixel signal;
a constant current source configured to supply a constant current to the vertical signal line; and
a comparison transistor that includes:
a source connected to the constant current source;
a gate configured to receive a reference signal; and
a drain configured to output a comparison result between the pixel signal and the reference signal.

* * * * *